(12) United States Patent
Cho et al.

(10) Patent No.: US 11,183,652 B2
(45) Date of Patent: Nov. 23, 2021

(54) FLEXIBLE ELECTRONIC DEVICE INCLUDING CONFORMAL FLEXIBLE PROTECTIVE LAYER

(71) Applicant: ELECTRONICS AND TELECOMMUNICATIONS RESEARCH INSTITUTE, Daejeon (KR)

(72) Inventors: Doo-Hee Cho, Daejeon (KR); Young-Sam Park, Daejeon (KR); Byoung Gon Yu, Chungcheongbuk-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 37 days.

(21) Appl. No.: 16/795,703

(22) Filed: Feb. 20, 2020

(65) Prior Publication Data

US 2020/0350506 A1 Nov. 5, 2020

(30) Foreign Application Priority Data

May 2, 2019 (KR) .......................... 10-2019-0051661

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3248* (2013.01); *H01L 27/3258* (2013.01);
(Continued)

(58) Field of Classification Search
CPC ............. H01L 51/0097; H01L 51/5253; H01L 27/3248; H01L 27/3258; H01L 27/3276;
(Continued)

(56) References Cited

U.S. PATENT DOCUMENTS 9,799,708 B2 10/2017 Hong et al.
10,243,169 B2 3/2019 Oh et al.
(Continued)

FOREIGN PATENT DOCUMENTS

KR 10-2014-0087130 A 7/2014
KR 10-2016-0110689 A 9/2016
(Continued)

OTHER PUBLICATIONS

Namsun Chou et al., "Fabrication of Stretchable and Flexible Electrodes Based On PDMS Substrate", MEMS 2012, Paris, France, pp. 247-250, Jan. 29-Feb. 2, 2012.

*Primary Examiner* — Lex H Malsawma
(74) *Attorney, Agent, or Firm* — Rabin & Berdo, P.C.

(57) ABSTRACT

Provided are a flexible electronic device including device units, a first etching preventing layer provided on the device units, a conductive line provided on the first etching preventing layer and electrically connected to the device units, a flexible substrate covering the conductive line on the first etching preventing layer and the conductive line, a trench separating the device units and exposing a portion of a bottom surface of the first etching preventing layer and a side surface of each of the device units, and a flexible protective layer conformally covering a bottom surface of each of the device units and an inside of the trench, wherein each of the device units includes a protective substrate, driving parts provided on the protective substrate, and a first encapsulation layer configured to cover the driving parts, and a manufacturing method thereof.

12 Claims, 20 Drawing Sheets

(51) Int. Cl.
*H01L 51/52* (2006.01)
*H01L 27/12* (2006.01)

(52) U.S. Cl.
CPC ...... *H01L 27/3276* (2013.01); *H01L 51/5253* (2013.01); *H01L 27/124* (2013.01); *H01L 27/1218* (2013.01); *H01L 27/1248* (2013.01); *H01L 27/3288* (2013.01); *H01L 2251/5338* (2013.01)

(58) Field of Classification Search
CPC ............... H01L 27/1218; H01L 27/124; H01L 27/1248; H01L 27/3288; H01L 2251/5338
See application file for complete search history.

(56) References Cited

U.S. PATENT DOCUMENTS

| | | | |
|---|---|---|---|
| 10,249,750 | B2 | 4/2019 | Bae et al. |
| 10,310,560 | B2 | 6/2019 | Choi et al. |
| 2007/0200496 | A1 | 8/2007 | Cok et al. |
| 2008/0218369 | A1* | 9/2008 | Krans ................. H01L 51/0097 340/691.1 |
| 2010/0116526 | A1* | 5/2010 | Arora ................. H01L 23/3121 174/254 |
| 2014/0144480 | A1* | 5/2014 | Lee ....................... H01L 31/048 136/244 |
| 2014/0299362 | A1 | 10/2014 | Park et al. |
| 2016/0049602 | A1* | 2/2016 | Kim .................... H01L 27/3244 257/40 |
| 2016/0268352 | A1* | 9/2016 | Hong ................. H01L 51/0097 |
| 2017/0271398 | A1* | 9/2017 | Oh ..................... H01L 25/0753 |

FOREIGN PATENT DOCUMENTS

| | | |
|---|---|---|
| KR | 10-2017-0024623 A | 3/2017 |
| KR | 10-1810050 B1 | 12/2017 |
| KR | 10-2019-0101270 A | 8/2019 |

\* cited by examiner

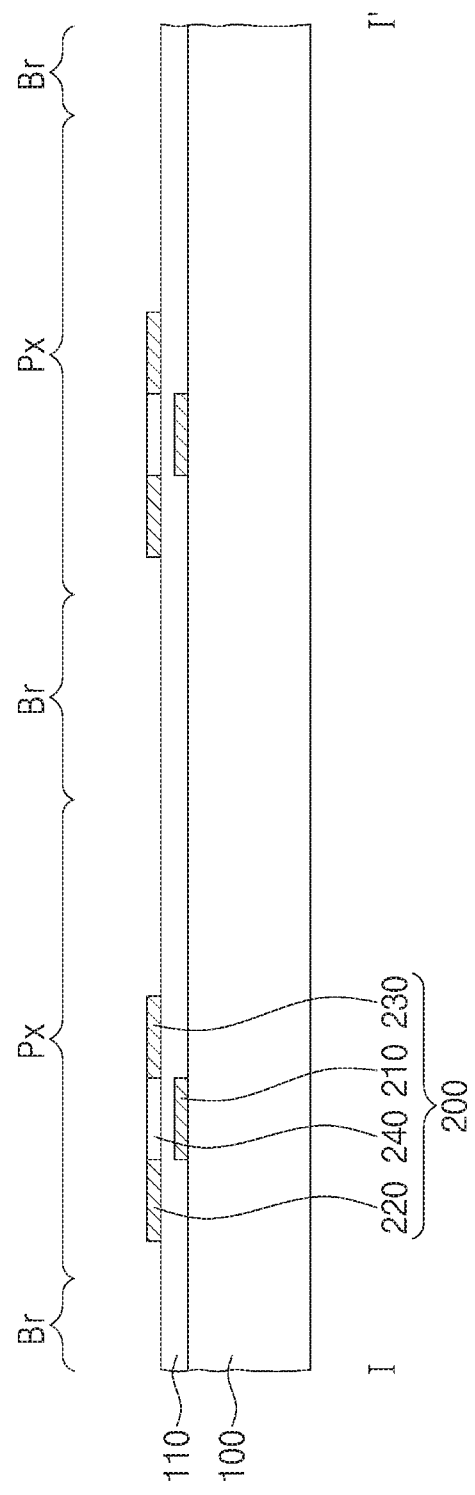

FLEXIBLE ELECTRONIC DEVICE INCLUDING CONFORMAL FLEXIBLE PROTECTIVE LAYER

CROSS-REFERENCE TO RELATED APPLICATIONS

This U.S. non-provisional patent application claims priority under 35 U.S.C. § 119 of Korean Patent Application No. 10-2019-0051661, filed on May 2, 2019, the entire contents of which are hereby incorporated by reference.

BACKGROUND

The present disclosure herein relates to a flexible electronic device, and more particularly, to a flexible electronic device that is flexible, conformable, and stretchable and a manufacturing method thereof.

Most of currently used electronic devices are manufactured by using a rigid substrate such as a sapphire ($Al_2O_3$) substrate, a silicon (Si) wafer, or a glass substrate. However, in recent years, an electronic device capable of operating on a flexible substrate, e.g., an electronic device attached to a body to real-time monitor changes in body or environment and expresses a result, has been highly demanded. The above-described flexible electronic device uses a substrate containing a highly flexible material such as a polymer in order to realize flexible, conformable, and stretchable characteristics.

SUMMARY

The present disclosure provides a flexible electronic device that is flexible, conformable, and stretchable.

The present disclosure also provides a simple method for manufacturing a flexible electronic device.

The object of the present invention is not limited to the aforesaid, but other objects not described herein will be clearly understood by those skilled in the art from descriptions below.

An embodiment of the inventive concept provides a flexible electronic device including: device units; a first etching preventing layer provided on the device units; a conductive line provided on the first etching preventing layer and electrically connected to the device units; a flexible substrate configured to cover the conductive line on the first etching preventing layer and the conductive line; a trench configured to separate the device units and expose a portion of a bottom surface of the first etching preventing layer and a side surface of each of the device units; and a flexible protective layer configured to conformally cover a bottom surface of each of the device units and an inside of the trench. Here, each of the device units includes a protective substrate, driving parts provided on the protective substrate, and a first encapsulation layer configured to cover the driving parts.

In an embodiment, the flexible substrate may have a plurality of pixel areas and a bridge area configured to surround the pixel areas, the device units may be provided on the pixel areas, respectively, and the trench may be provided on the bridge area.

In an embodiment, the first etching preventing layer may include a material having an etching selectivity with respect to the first encapsulation layer, and each of the flexible substrate and the flexible protective layer may include an insulating polymer.

In an embodiment, each of the driving parts may include a gate pattern, a source pattern, a drain pattern, and an active pattern, and the flexible electronic device may further include an insulating layer between the gate pattern and the first encapsulation layer.

In an embodiment, the source pattern, and the drain pattern may be electrically connected to the conductive line.

In an embodiment, the flexible electronic device may further include: light emitting parts provided on the first encapsulation layer; and a second encapsulation layer configured to cover the light emitting parts.

In an embodiment, each of the light emitting parts may include a first electrode, a light emitting layer, and a second electrode. Here, the first electrode may be electrically connected to the drain pattern, and the second electrode may be electrically connected to the conductive line.

In an embodiment, each of the protective substrate, the insulating layer, the first encapsulation layer, and the second encapsulation layer may include a gas barrier material. Here, the first encapsulation layer may seal the driving parts, and the second encapsulation layer may seal the light emitting parts.

In an embodiment, each of the first etching preventing layer, the conductive line, and the flexible substrate may extend to the bridge area, and the device units may be connected to each other by the first etching preventing layer and the flexible substrate.

In an embodiment, each of the first etching preventing layer, the conductive line, the flexible substrate, and the flexible protective layer may have a wrinkle structure on the bridge area.

In an embodiment, the bridge area may include openings. Here, the openings may expose a side surface of each of the first etching preventing layer, the flexible substrate, and the flexible protective layer, and the bridge area including the opening may have a curved shape to connect the pixel areas.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 10 to 15 are cross-sectional views for explaining a method for manufacturing the flexible electronic device according to an embodiment of the inventive concept and taken along line I-I' of FIG. 1;

DETAILED DESCRIPTION

Figure 1:
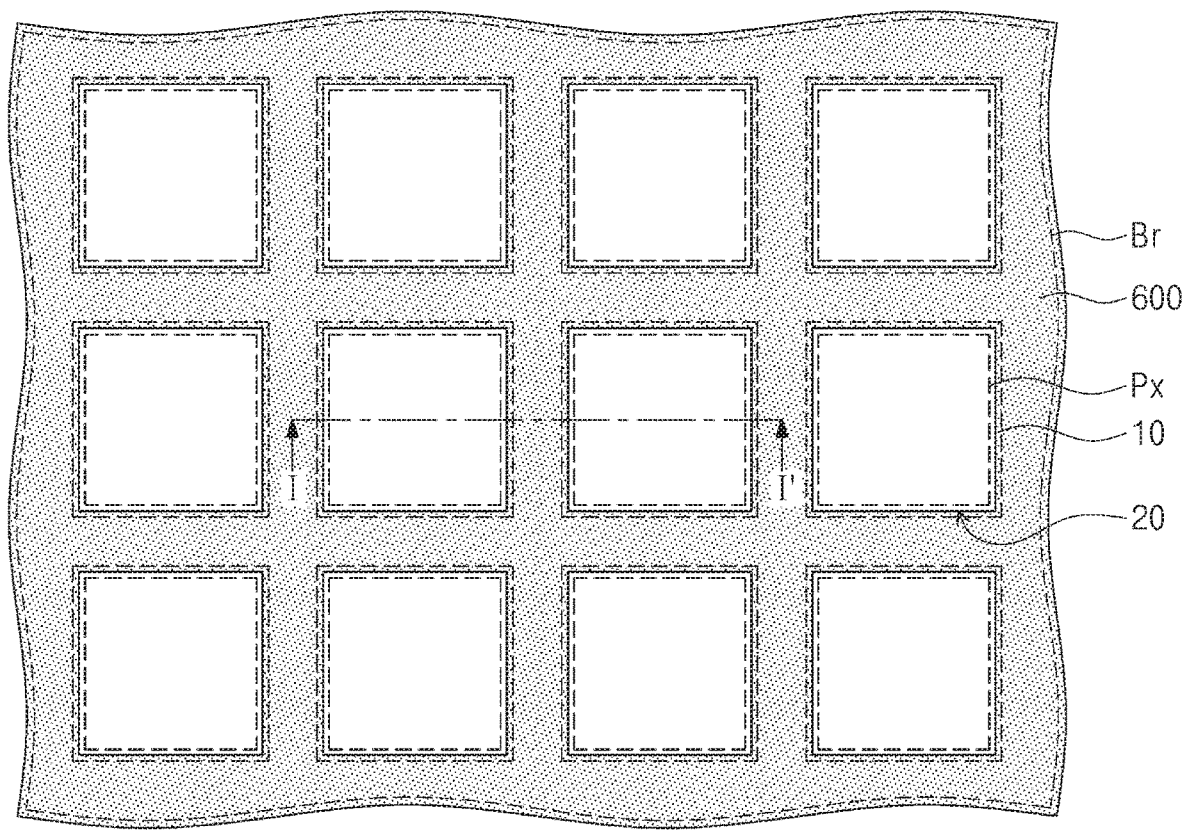
FIG. 1 is a plan view illustrating a flexible electronic device according to embodiments of the inventive concept.

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. In the figures, the sizes of the elements and the relative sizes between elements may be exaggerated for further understanding of the present invention.

In the following description, the technical terms are used only for explaining a specific exemplary embodiment while not limiting the present disclosure. The terms of a singular form may include plural forms unless referred to the contrary. The meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present invention, the regions and the layers are not limited to these terms. These terms are used only to discriminate one region or layer (or film) from another region or layer (or film). Therefore, a layer referred to as a first layer in one embodiment can be referred to as a second layer in another embodiment. An embodiment described and exemplified herein includes a complementary embodiment thereof. In this specification, like reference numerals refer to like elements throughout.

Unless terms used in embodiments of the present invention are differently defined, the terms may be construed as meanings that are commonly known to a person skilled in the art.

Hereinafter, a flexible electronic device and a method for manufacturing the same according to an embodiment of the inventive concept will be described with reference to FIGS. 1 to 19.

Figure 2:
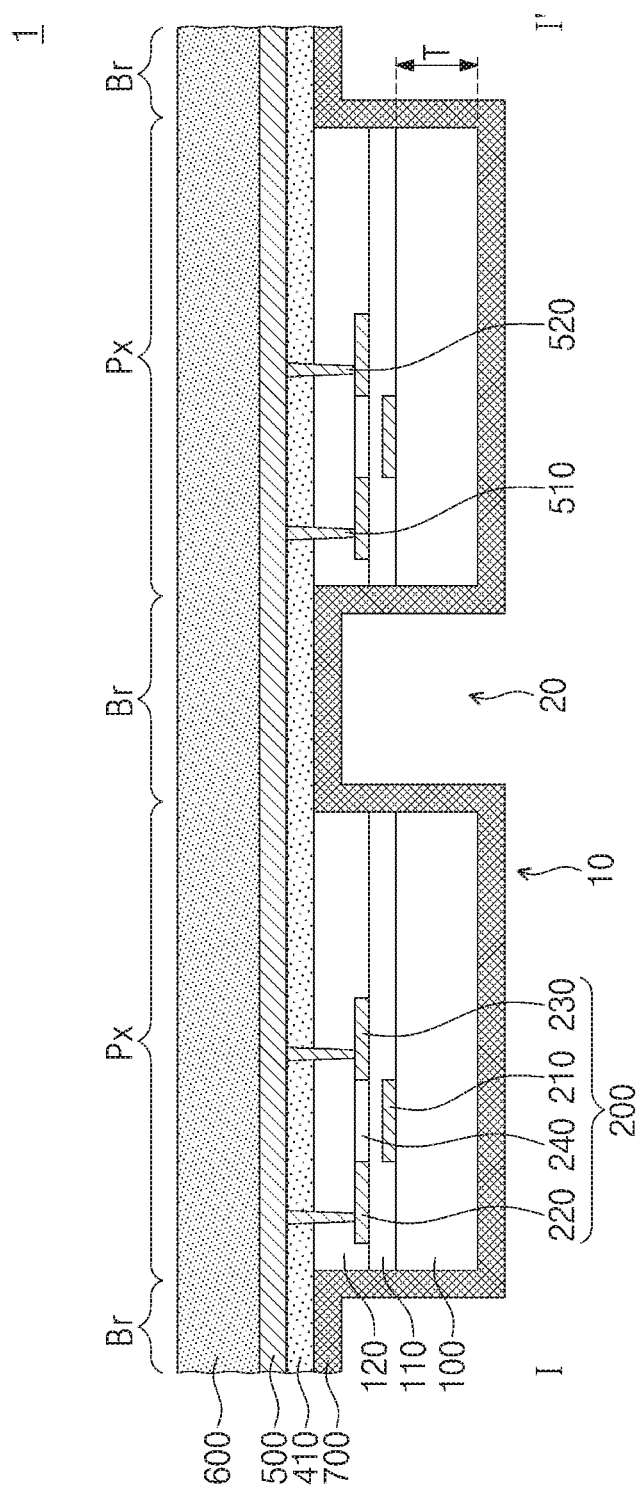
FIGS. 2 to 7 are cross-sectional views for explaining a flexible electronic device according to embodiments of the inventive concept and taken along line I-I' of FIG. 1.

FIG. 1 is a plan view illustrating a flexible electronic device according to embodiments of the inventive concept. FIG. 2 is a cross-sectional view illustrating the flexible electronic device according to an embodiment and taken along line I-I' of FIG. 1.

Referring to FIGS. 1 and 2, a flexible electronic device 1 may include device units 10, a first etching preventing layer 410, a conductive line 500, a flexible substrate 600, and a flexible protective layer 700. The flexible substrate 600 may have pixel areas Px and a bridge area Br in terms of the plane as in FIG. 1. The pixel areas Px may be spaced apart from each other. The bridge area Br may surround the pixel areas Px and separate the pixel areas Px from each other. The device units 10 may be disposed on the pixel areas Px, respectively. The device units 10 may not be provided on the bridge area Br. The device units 10 may be connected to each other by the bridge area Br of the flexible substrate 600.

Each of the device units 10 may include a protective substrate 100, an insulating layer 110, a first encapsulation layer 120, and a driving part 200. Hereinafter, the single device unit 10 and the flexible electronic device 1 including the same will be described for convenience of description.

The protective substrate 100 may include glass, plastic, silicon wafer, or stainless steel. The protective substrate 100 may contain a gas barrier material. The protective substrate 100 may have a low transmittance with respect to moisture and oxygen. For example, the protective substrate 100 may be transparent. The protective substrate 100 may have a thickness T of about 0.1 μm to about 150 μm, more particularly about 1 μm to about 50 μm. The protective substrate 100 may be relatively rigid and thus difficult to be bent or stretched. The protective substrate 100 may be removed after a trench 20 is defined during a manufacturing process. Thus, each of the device units 10 may not include the protective substrate 100. As the protective substrate 100 is omitted, a thickness of the entire flexible electronic device 1 may decrease.

For example, the driving part 200 may be provided on the protective substrate 100. The driving part 200 may include a gate pattern 210, a source pattern 220, a drain pattern 230, and an active pattern 240. The gate pattern 210 may be provided on the protective substrate 100. The gate pattern 210 may include a conductive material such as metal, a transparent conductive oxide, or a polysilicon. A gate line (not shown) may be further provided on the protective substrate 100 and electrically connected to the gate pattern 210. According to another embodiment, unlike as illustrated, the driving part 200 may include elements of another electronic device instead of the gate pattern 210, the source pattern 220, the drain pattern 230, and the active pattern 240 of a thin-film transistor.

The insulating layer 110 may be provided on the protective substrate 100 to cover the gate pattern 210. The insulating layer 110 may be a gate insulating layer. The insulating layer 110 may include a gas barrier material. The insulating layer 110 may be a single layer or multilayers. For example, the insulating layer 110 may include a silicon oxide ($SiO_2$), a silicon nitride ($SiN_x$), an aluminum oxide ($Al_2O_3$), and/or an insulating polymer. The insulating layer 110 may be relatively rigid and thus difficult to be bent or stretched.

The source pattern 220 and the drain pattern 230 may be provided on the insulating layer 110. The drain pattern 230 may be spaced sideways from the source pattern 220. Each of the source pattern 220 and the drain pattern 230 may include a conductive material such as metal and/or a transparent conductive oxide.

The active pattern 240 may be provided on the insulating layer 110. The active pattern 240 may be disposed between the source pattern 220 and the drain pattern 230. The active pattern 240 may overlap the gate pattern 210 in terms of the plane. The active pattern 240 may include a semiconductor material. For example, the active pattern 240 may include amorphous silicon, crystalline silicon, an oxide semiconductor, and/or an organic semiconductor material. The active pattern 240 may function as a channel of the driving part 200.

The first encapsulation layer 120 may be disposed on the insulating layer 110 to cover the source pattern 220, the drain pattern 230, and the active pattern 240. The first encapsulation layer 120 may have a size greater than that of the entire driving part 200. The first encapsulation layer 120 may contain an insulating material. The first encapsulation layer 120 may contain a gas barrier material. The first encapsulation layer 120 may be a single layer or multilayers. For example, the first encapsulation layer 120 may include at least one of an organic layer and an inorganic layer. For example, the inorganic layer may include $TiO_2$, $WO_3$, ZnO, ITO (indium tin oxide), $SnO_2$, $In2O_3$, $ZrO_2$, IZO (indium zinc oxide), $Al_2O_3$, $SiN_x$, and/or $SiN_xO_y$ (here, x and y are real numbers greater than 0). The organic layer may include a polymer such as polyimide and/or polyethylene. When the first encapsulation layer 120 has multilayers, the first encapsulation layer 120 may include a first inorganic layer, an organic layer, and a second inorganic layer, which are stacked with each other. A material of each of the first inorganic layer and the second inorganic layer is the same as described in an example of the inorganic layer. The first encapsulation layer 120 may prevent external impurities (e.g., air or moisture) from being introduced to the driving part 200. For example, when the first encapsulation layer 120 includes a ceramic thin-film, the ceramic thin-film may have a low oxygen and moisture transmittance. Here, the ceramic thin-film may prevent the external impurities from being introduced to the driving part 200. Since the first encapsulation layer 120 is relatively rigid, the first encapsulation layer 120 may be difficult to be bent or stretched. Although not shown, a protective layer (not shown) may be further provided between the active pattern 240 and the first encapsulation layer 120 to cover the active pattern 240. The protective layer (not shown) may contain an insulating material. The protective layer (not shown) may protect the active pattern 240 to prevent and reduce deterioration of the active pattern 240. The first etching preventing layer 410 may be provided on the first encapsulation layer 120. The first etching preventing layer 410 may include various organic materials and/or a polymer material such as polyimide, polyethylene, or polystyrene. For example, the first etching preventing layer 410 may include a low molecular organic material that is easily deposited. The first etching preventing layer 410 may have an etching selectivity with respect to the second encapsulation layer 130. The first etching preventing layer 410 may be flexible, conformable, and stretchable.

A first conductive via 510 and a second conductive via 520 may be provided in the first etching preventing layer 410 and the first encapsulation layer 120. Each of the first conductive via 510 and the second conductive via 520 may contain metal. The first conductive via 510 may pass through the first etching preventing layer 410 and the first encapsulation layer 120 and be connected to the source pattern 220. The second conductive via 520 may pass through the first etching preventing layer 410 and the first encapsulation layer 120 and be connected to the drain pattern 230. The first conductive via 510 and the second conductive via 520 may be spaced apart from each other. The first conductive via 510 and the second conductive via 520 may be insulated from each other.

The conductive line 500 may be provided on the first etching preventing layer 410. The conductive line 500 may contain metal. The conductive line 500 may be flexible, conformable, and stretchable. The conductive line 500 may be connected to the first conductive via 510 and the second conductive via 520. The conductive line 500 may be electrically connected to the source pattern 220 through the first conductive via 510. The conductive line 500 may be electrically connected to the drain pattern 230 through the second conductive via 520. Thus, a current may flow to the source pattern 220 through the conductive line 500 and the first conductive via 510. Accordingly, a current may flow to the conductive line 500 through the drain pattern 230 and the second conductive via 520. A flow direction of the current may be opposite to the above.

The flexible substrate 600 may be provided on the first etching preventing layer 410 and the conductive line 500 to cover the conductive line 500. The flexible substrate 600 may include an insulating polymer. For example, the flexible substrate 600 may include polyimide and/or polydimethylsiloxane (PDMS). Also, for example, the flexible substrate 600 may include a light scattering layer material in which two or more materials having different refractive indexes are mixed. The flexible substrate 600 may be flexible, conformable, and stretchable.

The trench 20 may be defined on the bridge area Br to separate the device units 10 from each other. The trench 20 may not expose the driving part 200. The trench 20 may expose a portion of a bottom surface of the first etching preventing layer 410. The trench 20 may expose a sidewall of each device unit 10. For example, the trench 20 may expose a sidewall of the protective substrate 100, a sidewall of the insulating layer 110, a sidewall of the first encapsulation layer 120, and a bottom surface of the first etching preventing layer 410 of each device unit 10.

The flexible protective layer 700 may be provided to conformally cover a bottom surface of each device unit 10 and an inside of each trench 20. The flexible protective layer 700 may include an insulating polymer. For example, the flexible protective layer 700 may include polyimide and/or polydimethylsiloxane (PDMS). The flexible protective layer 700 may be flexible, conformable, and stretchable. The flexible protective layer 700 may be provided to cover the sidewall of the protective substrate 100, the sidewall of the insulating layer 110, the sidewall of the first encapsulation layer 120, and the bottom surface of the first etching preventing layer 410 of each device unit 10 and prevent the same from being exposed to the outside. According to another embodiment, unlike as illustrated, the flexible protective layer 700 may partially fill the trench 20. According to another embodiment, unlike as illustrated, the flexible protective layer 700 may not be provided.

Each of the first etching preventing layer 410, the conductive line 500, and the flexible substrate 600 may extend over the bridge area Br. For example, the first etching preventing layer 410, the conductive line 500, and the flexible substrate 600 may overlap the pixel areas Px and the bridge area Br in terms of the plane. Thus, the device units 10 may be physically connected to each other by the first etching preventing layer 410, the conductive line 500, and the flexible substrate 600. The conductive line 500 may be connected to the gate patterns 210, the source patterns 220, and the drain patterns 230 of different device units 10. For example, although not shown in FIG. 2, the conductive line 500 may be connected to the gate pattern 210 of one of the device units 10 and the gate pattern 210 of another of the device units 10. Also, for example, the conductive line 500 may be connected to the source pattern 220 of one of the device units 10 and the source pattern 220 of another of the device units 10. Also, for example, the conductive line 500 may be connected to the drain pattern 230 of one of the device units 10 and the drain pattern 230 of another of the device units 10.

Figure 3:
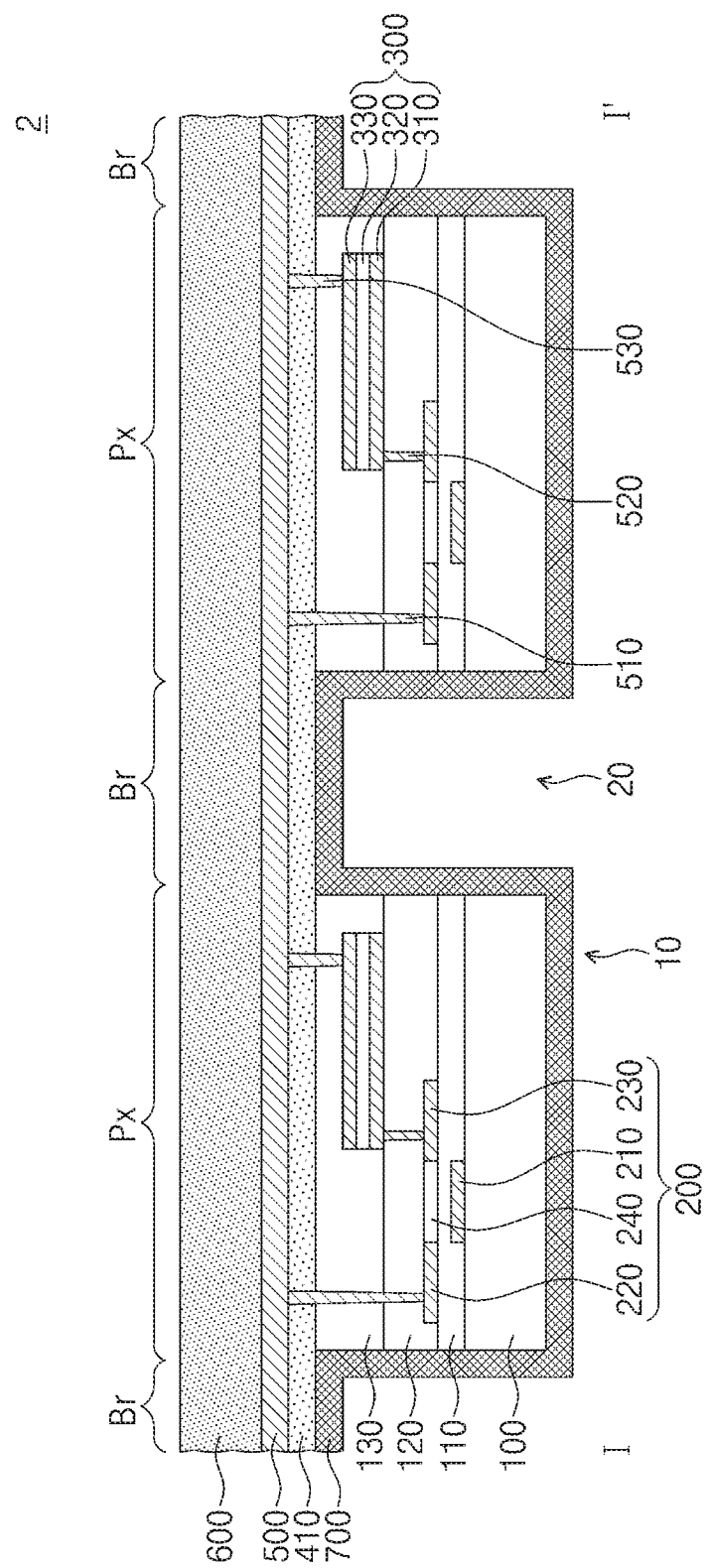

FIG. 3 is a cross-sectional view illustrating a flexible electronic device according to another embodiment and taken along line I-I' of FIG. 1.

Referring to FIGS. 1 and 3, a flexible electronic device 2 may include device units 10, a first etching preventing layer 410, a conductive line 500, a flexible substrate 600, and a flexible protective layer 700. As illustrated in FIG. 3, each of the device units 10 may include a second encapsulation layer 130 and a light emitting part 300 in addition to a protective substrate 100, an insulating layer 110, a first encapsulation layer 120, and a driving part 200. The protective substrate 100, the insulating layer 110, the first encapsulation layer 120, the driving part 200, the first etching preventing layer 410, the flexible substrate 600, and the flexible protective layer 700 may be substantially the same as described above. Hereinafter, the single device unit 10 will be described for simplicity of description.

The light emitting part 300 may be provided on the first encapsulation layer 120. The light emitting part 300 may include a first electrode 310, a light emitting layer 320, and a second electrode 330, which are stacked with each other. According to another embodiment, unlike as illustrated, the light emitting part 300 may further include an electrode connection portion (not shown). Here, the electrode connection portion (not shown) may be provided on the first encapsulation layer 120 and connected to the second electrode 330.

The first electrode 310 may be provided on the first encapsulation layer 120. The first electrode 310 may contain a conductive material. For example, the first electrode 310 may contain a transparent conductive oxide. Here, the first electrode 310 may have a thickness of about 50 nm to about 150 nm. When the first electrode 310 has a thickness greater than about 150 nm, transparency of the first electrode 310 may be reduced. For another example, the first electrode 310 may contain metal and function as a reflective electrode.

A second conductive via 520 may be provided in the first encapsulation layer 120. The second conductive via 520 may contain metal. The second conductive via 520 may pass through the first encapsulation layer 120 and be electrically connected to a drain pattern 230. The first electrode 310 may be electrically connected to the drain pattern 230 through the second conductive via 520.

The light emitting layer 320 may be provided on the first electrode 310. The light emitting layer 320 may generate light. For example, the light generated in the light emitting layer 320 may be discharged to the outside through the first electrode 310 and the protective substrate 100. Here, the first electrode 310, the first encapsulation layer 120, the insulating layer 110, and the protective substrate 100 may be transparent. For another example, the light emitted from the light emitting layer 320 may be discharged to the outside through the second electrode 330. Here, the second electrode 330 may be transparent. The light emitting layer 320 may include a hole injection layer, a hole transporting layer, an organic light emitting layer, an electron transporting layer, and an electron injection layer, which are stacked with each other.

The second electrode 330 may be provided on the light emitting layer 320. The second electrode 330 may contain metal. The first electrode 310 may contain a conductive material and be opaque. The second electrode 330 may function as a reflective electrode. For example, the light generated in the light emitting layer 320 may be reflected by the second electrode 330 and discharged through the first electrode 310 and the protective substrate 100. Thus, a light extraction efficiency of the light emitting part 300 may increase. The second electrode 330 may have a thickness greater than that of the first electrode 310. For example, the second electrode 330 may have a thickness of about 50 nm to about 150 nm. When the second electrode 330 has a thickness equal to or greater than about 50 nm, a rate of light reflected by the second electrode 330 may further increase. Alternatively, the second electrode 330 may function as a transparent electrode. One of the first electrode 310 and the second electrode 330 may function as a cathode, and the other may function as an anode.

The second encapsulation layer 130 may be provided on the first encapsulation layer 120 to cover a top surface and side surfaces of the light emitting part 300. For example, the second encapsulation layer 130 may cover side surfaces of the first electrode 310, side surface of the light emitting layer 320, side surfaces of the second electrode 330, and a top surface of the second electrode 330. The second encapsulation layer 130 may have a size greater than that of the light emitting part 300. The second encapsulation layer 130 may seal the light emitting part 300. The second encapsulation layer 130 may include substantially the same material and structure as the first encapsulation layer 120 that is previously described with reference to FIG. 2. For example, when the first and second encapsulation layers 120 and 130 include the same material as each other, a trench 20 may be easily provided later. The second encapsulation layer 130 may prevent external impurities (e.g., air or moisture) from being introduced. Thus, the second encapsulation layer 130 may prevent the light emitting part 300 from being damaged. The second encapsulation layer 130 may be relatively rigid and thus difficult to be bent or stretched.

A first conductive via 510 may be provided in the first etching preventing layer 410, the second encapsulation layer 130, and the first encapsulation layer 120. The first conductive via 510 may contain metal. The first conductive via 510 may pass through the first etching preventing layer 410, the second encapsulation layer 130, and the first encapsulation layer 120 and be connected to a source pattern 220. The first conductive via 510 may be spaced apart from the second conductive via 520 and a third conductive via 530. The first conductive via 510 may be insulated from the second conductive via 520 and the third conductive via 530.

The third conductive via 530 may be provided in the first etching preventing layer 410 and the second encapsulation layer 130. The third conductive via 530 may contain metal. The third conductive via 530 may pass through the first etching preventing layer 410 and the second encapsulation layer 130 and be connected to the second electrode 330. The third conductive via 530 may be spaced apart from the second conductive via 520. The third conductive via 530 may be insulated from the second conductive via 520. According to another embodiment, unlike as illustrated, the third conductive via 530 may be connected to an electrode connection portion (not shown). According to another embodiment, unlike as illustrated, the third conductive via 530 may include a plurality of stacked vias.

Also, although not shown in FIG. 3, a fourth conductive via (not shown) may be provided in the first etching preventing layer 410, the second encapsulation layer 130, the first encapsulation layer 120, and the insulating layer 110. The fourth conductive via (not shown) may contain metal. The fourth conductive via (not shown) may pass through the first etching preventing layer 410, the second encapsulation layer 130, and the first encapsulation layer 120 and be connected to a gate pattern 210. The fourth conductive via (not shown) may be spaced apart from the first conductive via 510, the second conductive via 520 and the third conductive via 530. The fourth conductive via (not shown) may be insulated from the first conductive via 510, the second conductive via 520, and the third conductive via 530.

The conductive line 500 may be provided on the first etching preventing layer 410. The conductive line 500 may contain metal. The conductive line 500 may be connected to the first conductive via 510 and the third conductive via 530

The conductive line 500 may be electrically connected to the source pattern 220 through the first conductive via 510. The conductive line 500 may be electrically connected to the second electrode 330 through the third conductive via 530. Thus, a current may flow to the source pattern 220 through the conductive line 500 and the first conductive via 510. Accordingly, a current may flow to the conductive line 500 through the second electrode 330 and the conductive line 500. A flow direction of the current may be opposite to the above. The conductive line 500 may be flexible, conformable, and stretchable. According to another embodiment, unlike as illustrated, the conductive line 500 may be connected to an electrode connection portion (not shown) through the third conductive via 530. According to another embodiment, unlike as illustrated, an additional conductive line (not shown), which is electrically connected to the second electrode 330 through the third conductive via 530, may be provided on the flexible substrate 600. Here, an additional flexible substrate (not shown) may be provided on the additional conductive line (not shown). Here, the additional conductive line (not shown) may be provided perpendicularly to the conductive line 500. According to another embodiment, unlike as illustrated, an additional conductive line (not shown), which is electrically connected to the gate pattern 210 through the fourth conductive via (not shown), may be provided on the flexible substrate 600. Here, the additional flexible substrate (not shown) may be provided on the additional conductive line (not shown). Here, the additional conductive line (not shown) may be provided perpendicularly to the conductive line 500. Hereinafter, a description of providing the additional conductive line (not shown) and the additional flexible substrate (not shown) will not be repeated for simplicity of description.

As in FIG. 3, when the flexible electronic device 2 include the driving part 200 and the light emitting part 300, the flexible electronic device 2 may function as an active-matrix organic light-emitting diode (AMOLED). According to another embodiment, unlike as illustrated, the driving part 200 may be omitted. Here, the flexible electronic device 2 may function as a passive-matrix organic light-emitting diode, (PMOLED) or an organic light emitting diode lamp. However, this is merely an example. The flexible electronic device 2 may include various electronic devices in addition to the driving part 200 and the light emitting part 300.

Figure 4:
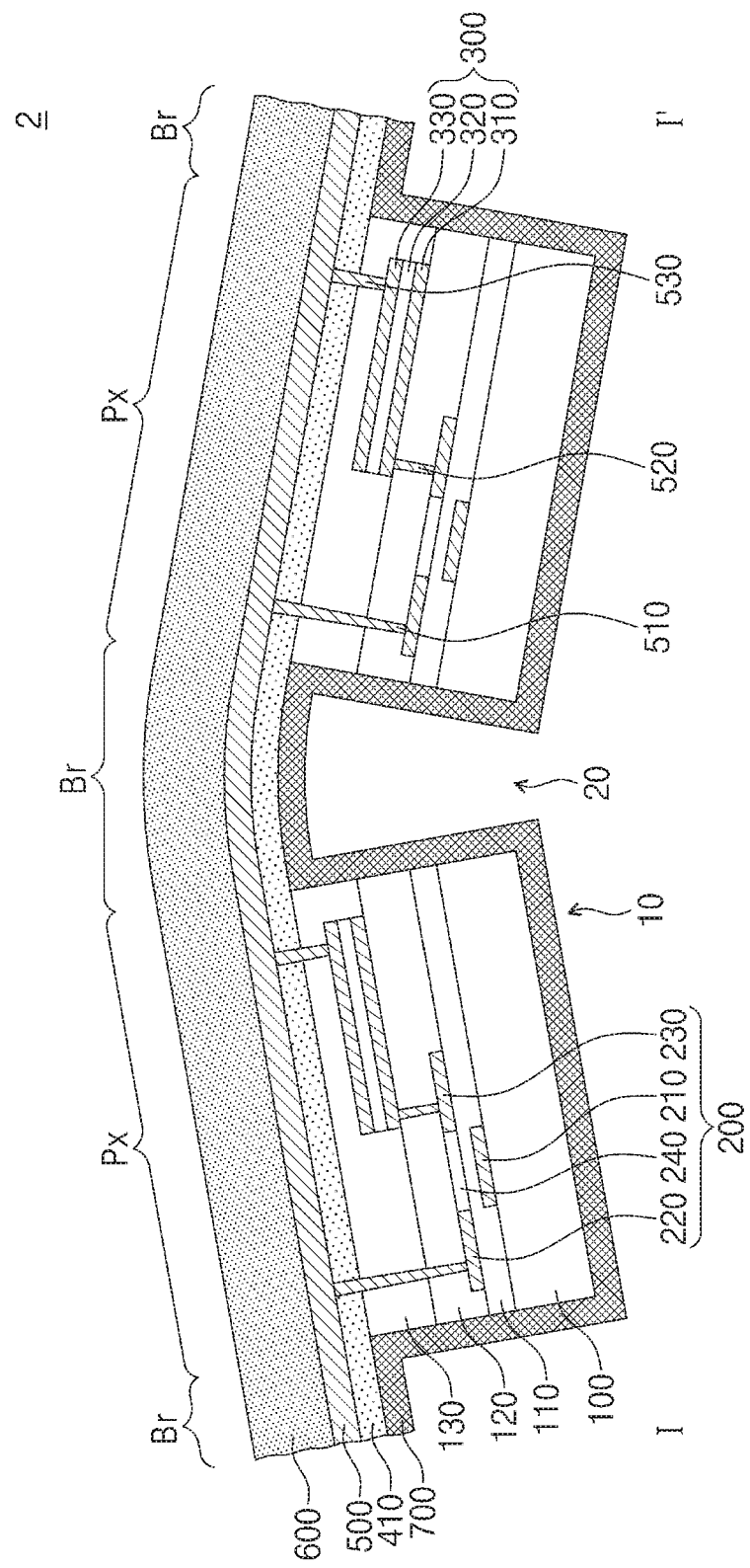

FIG. 4 is a cross-sectional view illustrating a bent state of the flexible electronic device in FIG. 3 and taken along line I-I' of FIG. 1. Hereinafter, in descriptions, the pixel areas of the flexible electronic device correspond to the pixel areas of the flexible substrate, and the bridge area of the flexible electronic device corresponds to the bridge area of the flexible substrate.

Referring to FIGS. 1 and 4, the flexible electronic device 2 may be bent. Here, the bridge area Br of the flexible electronic device 2 may be bent, and the pixel areas Px may not be bent. Since the first etching preventing layer 410, the conductive line 500, the flexible substrate 600, and the flexible protective layer 700 may be relatively flexible and conformable, the bridge area Br of the flexible electronic device 2 may be easily bent. Similarly, since the first etching preventing layer 410, the conductive line 500, the flexible substrate 600, and the flexible protective layer 700 may be relatively stretchable, the bridge area Br of the flexible electronic device 2 may be easily stretched.

When the pixel areas Px are bent or stretched, the device units 10 may be damaged. For example, the driving part 200 and the light emitting part 300 of each device unit 10. Since the protective substrate 100, the insulating layer 110, the first encapsulation layer 120, and the second encapsulation layer 130 are relatively rigid, the device units 10 may not be easily bent. Thus, although the bridge area Br of the flexible electronic device 2 is bent, the pixel areas Px of the flexible electronic device 2 may not be bent. Accordingly, the device units 10 may not be damaged.

Hereinafter, a flexible electronic device according to other embodiments also may be bent or stretched without damaging the device units 10 in the same manner as described above.

Figure 5:
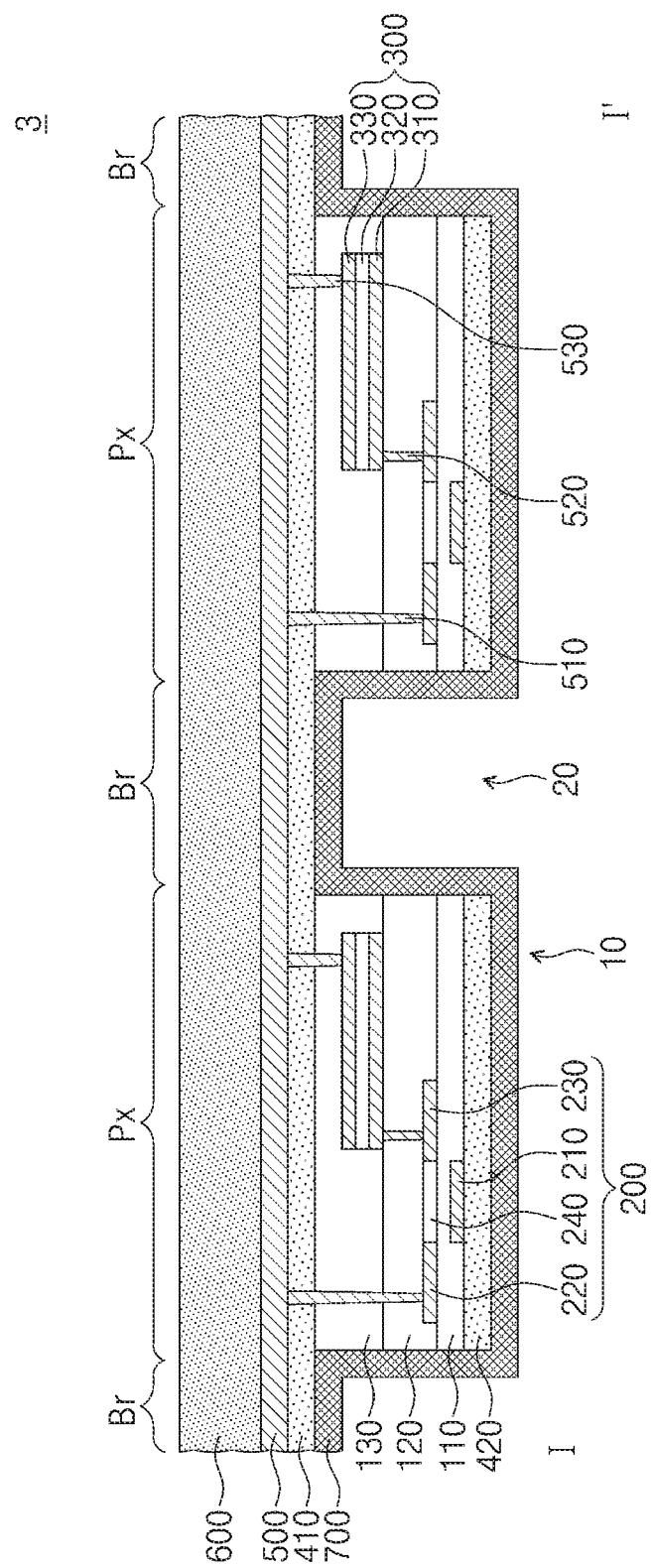

FIG. 5 is a cross-sectional view illustrating a flexible electronic device according to another embodiment and taken along line I-I' of FIG. 1.

Referring to FIGS. 1, 2, and 5, a flexible electronic device 3 may include device units 10, a first etching preventing layer 410, a conductive line 500, a flexible substrate 600, and a flexible protective layer 700. As illustrated in FIG. 5, each of the device units 10 may include a second etching preventing layer 420 in addition to an insulating layer 110, a first encapsulation layer 120, a second encapsulation layer 130, a driving part 200, and a light emitting part 300. Components except for the second etching preventing layer 420 may be substantially the same as described above. Hereinafter, the single device unit 10 will be described for simplicity of description.

The second etching preventing layer 420 may be provided on the protective substrate 100 in correspondence to the pixel areas Px. The second etching preventing layer 420 may include various organic materials and/or a polymer material such as polyimide, polyethylene, or polystyrene. For example, the second etching preventing layer 420 may include a low molecular organic material that is easily deposited. The insulating layer 110 may be provided on the second etching preventing layer 420 and the protective substrate 100. The second etching preventing layer 420 may have an etching selectivity with respect to the insulating layer 110. Thereafter, the protective substrate 100 may be removed.

Figure 6:
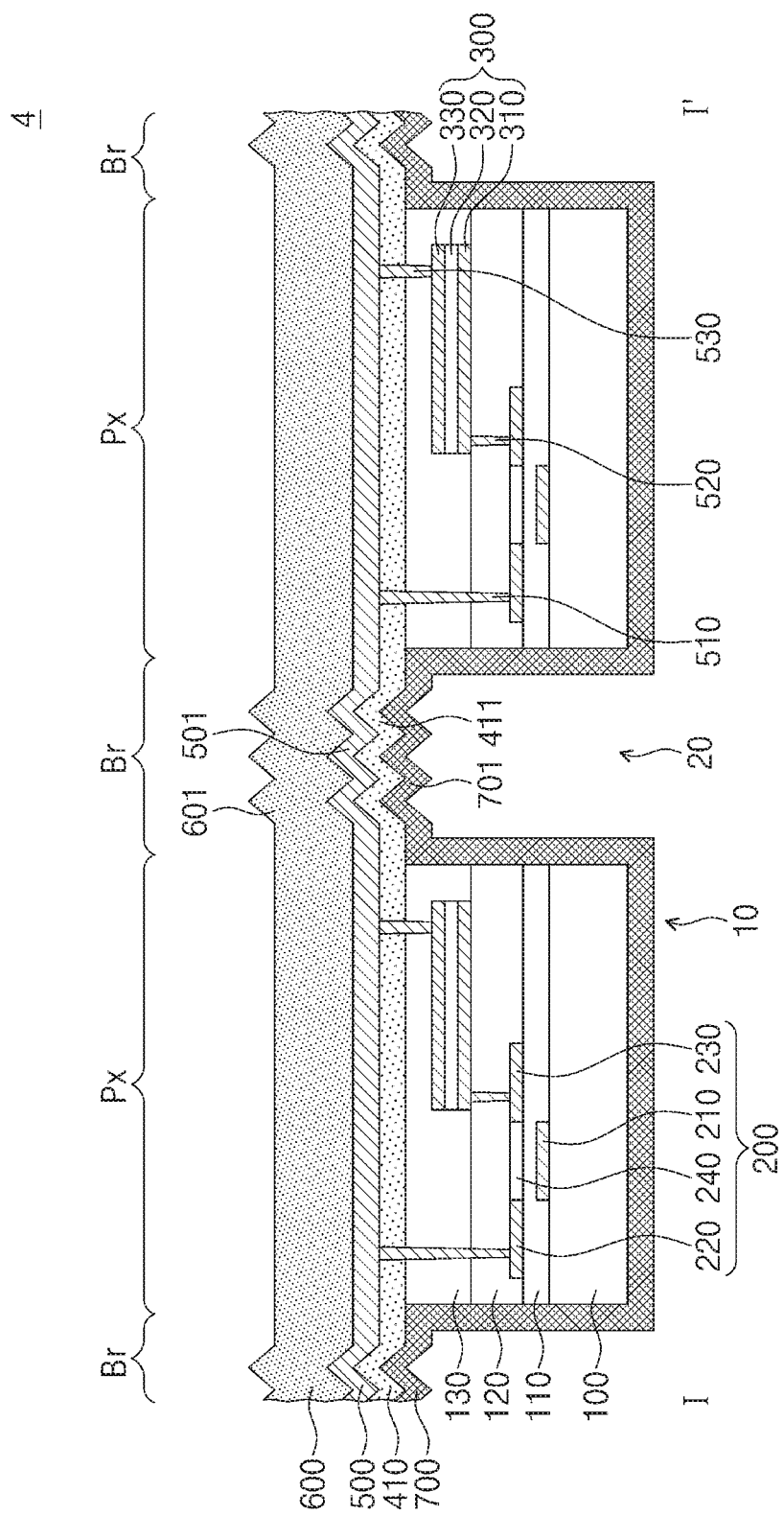

FIG. 6 is a cross-sectional view illustrating a flexible electronic device according to another embodiment and taken along line I-I' of FIG. 1.

Referring to FIGS. 1 and 6, a flexible electronic device 4 may include device units 10, a first etching preventing layer 410, a conductive line 500, a flexible substrate 600, and a flexible protective layer 700. Each of the device units 10 may include a protective substrate 100, an insulating layer 110, a first encapsulation layer 120, a second encapsulation layer 130, a driving part 200, and a light emitting part 300. The protective substrate 100, the insulating layer 110, the first encapsulation layer 120, the second encapsulation layer 130, the driving part 200, and the light emitting part 300 may be substantially the same as described above. However, the first etching preventing layer 410 may have a wrinkle structure 411, and the wrinkle structure 411 of the first etching preventing layer 410 may be provided on the bridge area Br. The first etching preventing layer 410 on the pixel areas Px may be flat. The wrinkle structure 411 of the first etching preventing layer 410 may have substantially the same thickness as that of the first etching preventing layer 410 on the pixel areas Px. Although a portion of a cross-section of the wrinkle structure 411 of the first etching preventing layer 410 may have a "U"-shape, a "V"-shape, or a rotated "S"-shape, the embodiment of the inventive concept is not limited thereto.

The conductive line 500 may have a wrinkle structure 501, and the wrinkle structure 501 of the conductive line 500 may be provided on the bridge area Br. The wrinkle structure 501 of the conductive line 500 may extend along the wrinkle structure 411 of the first etching preventing layer 410. The wrinkle structure 501 of the conductive line 500 may have a shape corresponding to the wrinkle structure 411 of the first etching preventing layer 410.

The flexible substrate 600 may have a wrinkle structure 601. The wrinkle structure 601 of the flexible substrate 600 may be provided on the bridge area Br. The wrinkle structure 601 of the flexible substrate 600 may be provided on the wrinkle structure 411 of the first etching preventing layer 410 and the wrinkle structure 501 of the conductive line 500. The wrinkle structure 601 of the flexible substrate 600 may have a shape corresponding to the wrinkle structure 411 of the first etching preventing layer 410 and the wrinkle structure 501 of the conductive line 500.

The flexible protective layer 700 may have a wrinkle structure 701. The wrinkle structure 701 of the flexible protective layer 700 may be provided on the bridge area Br. The wrinkle structure 701 of the flexible protective layer 700 may be provided on a bottom surface of the wrinkle structure 411 of the first etching preventing layer 410. The wrinkle structure 701 of the flexible protective layer 700 may have a shape corresponding to the wrinkle structure 411 of the first etching preventing layer 410, the wrinkle structure 501 of the conductive line 500, and the wrinkle structure 601 of the flexible substrate 600.

The flexible, conformable, and stretchable characteristics of the flexible electronic device 4 may be enhanced by the wrinkle structure 411 of the first etching preventing layer 410, the wrinkle structure 501 of the conductive line 500, the wrinkle structure 601 of the flexible substrate 600, and the wrinkle structure 701 of the flexible protective layer 700.

The wrinkle structure 411 of the first etching preventing layer 410, the wrinkle structure 501 of the conductive line 500, the wrinkle structure 601 of the flexible substrate 600, and the wrinkle structure 701 of the flexible protective layer 700 may not be provided on the pixel areas Px.

Figure 7:
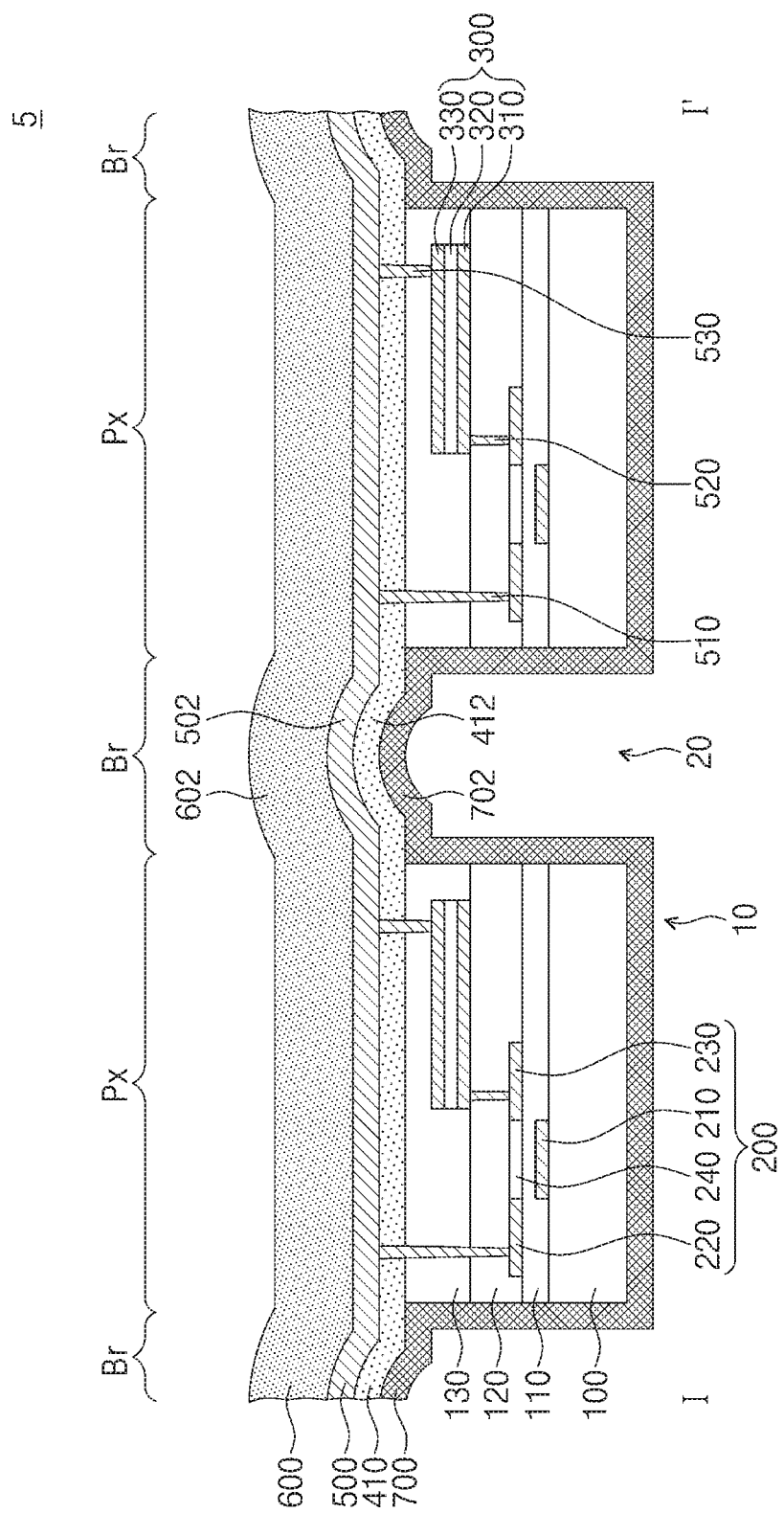

FIG. 7 is a cross-sectional view illustrating a flexible electronic device according to another embodiment and taken along line I-I' of FIG. 1.

Referring to FIGS. 1 and 7, a protective substrate 100, an insulating layer 110, a first encapsulation layer 120, a second encapsulation layer 130, a driving part 200, and a light emitting part 300 of a flexible electronic device 5 may be substantially the same as described above. However, the wrinkle structure 411 of the first etching preventing layer 410, the wrinkle structure 501 of the conductive line 500, the wrinkle structure 601 of the flexible substrate 600, and the wrinkle structure 701 of the flexible protective layer 700, which are provided on the bridge area Br, may be replaced by a slab structure 412 of the first etching preventing layer 410, a slab structure 502 of the conductive line 500, a slab structure 602 of the flexible substrate 600, and a slab structure 702 of the flexible protective layer 700. Although a portion of a cross-section of each of the slab structure 412 of the first etching preventing layer 410, the slab structure 502 of the conductive line 500, the slab structure 602 of the flexible substrate 600, and the slab structure 702 of the flexible protective layer 700 may have a shape such as a circular arc or an elliptical arc, the embodiment of the inventive concept is not limited thereto.

Figure 8:
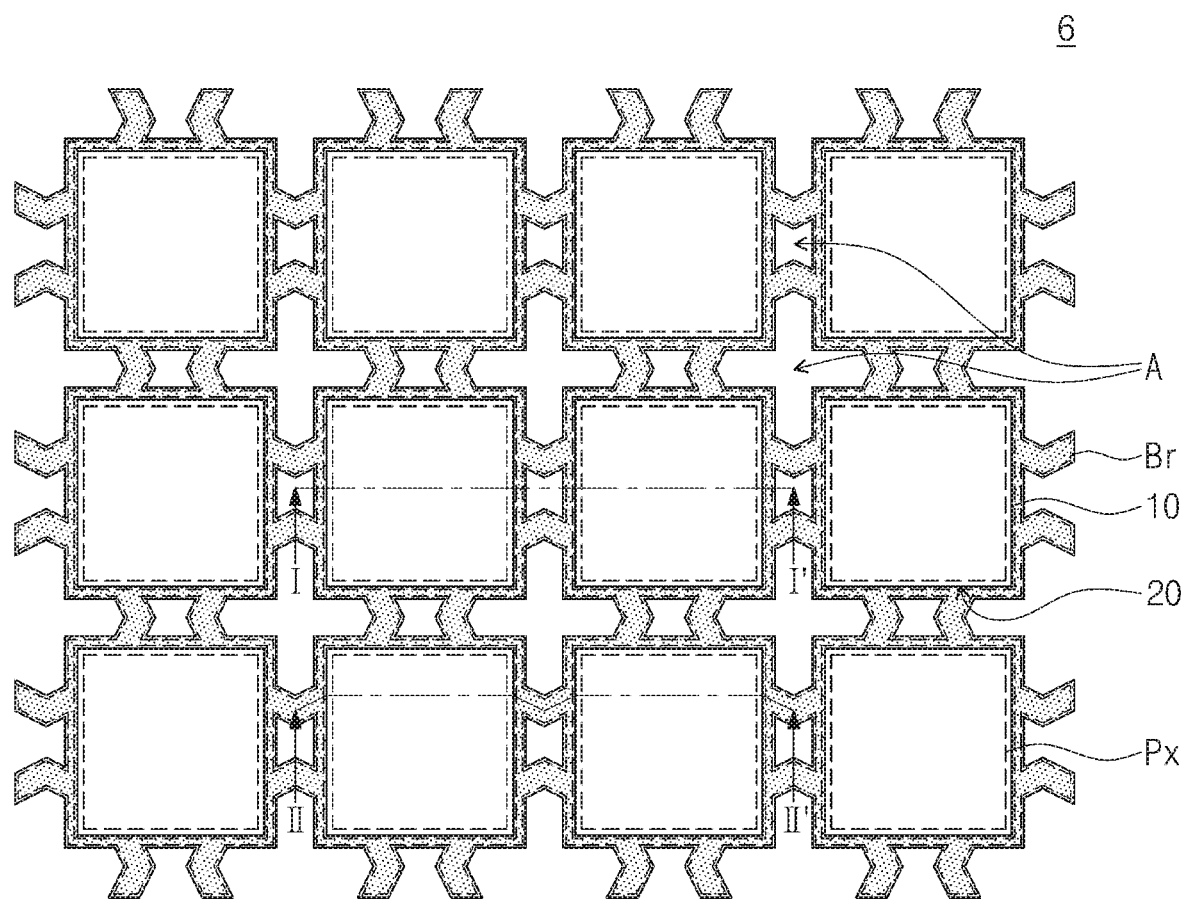
FIG. 8 is a plan view illustrating a flexible electronic device according to an embodiment of the inventive concept.
Figure 9A:
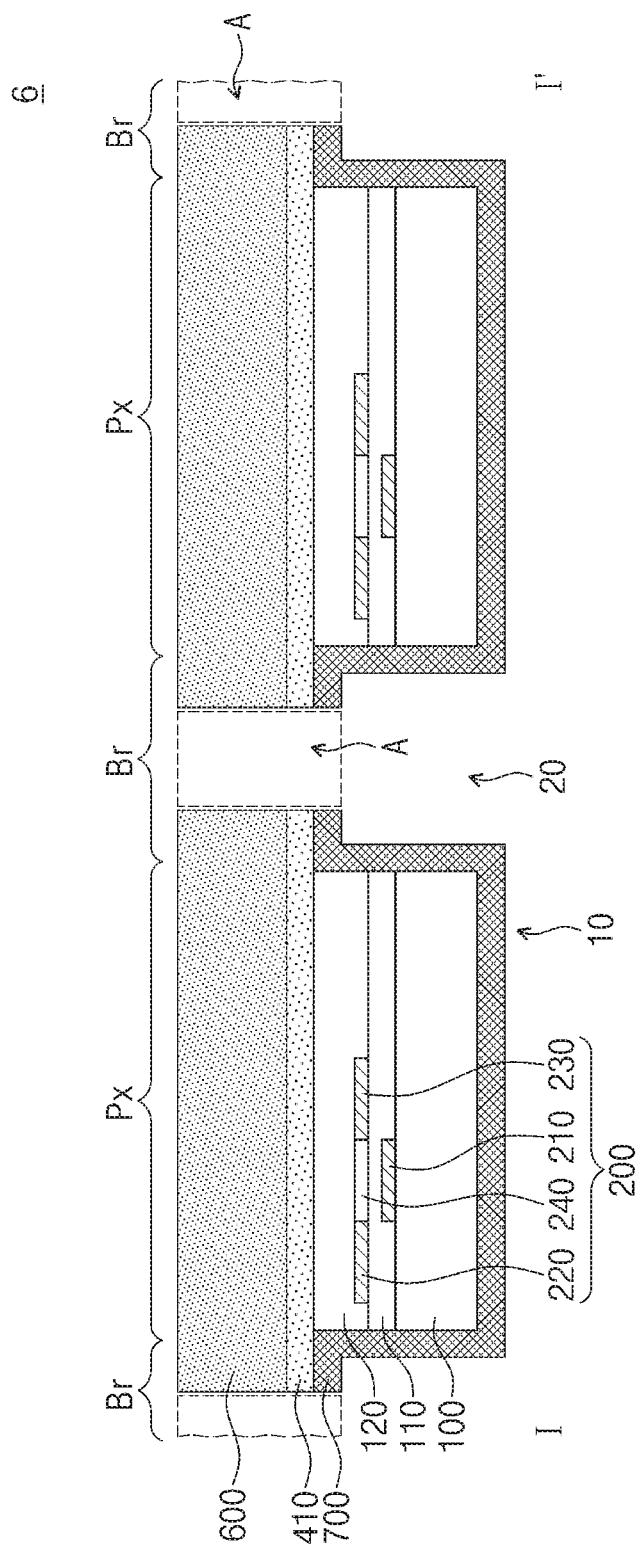
FIGS. 9A and 9B are cross-sectional views illustrating the flexible electronic device according to an embodiment of the inventive concept and taken along lines I-I' and II-II' of FIG. 8, respectively.
Figure 9B:
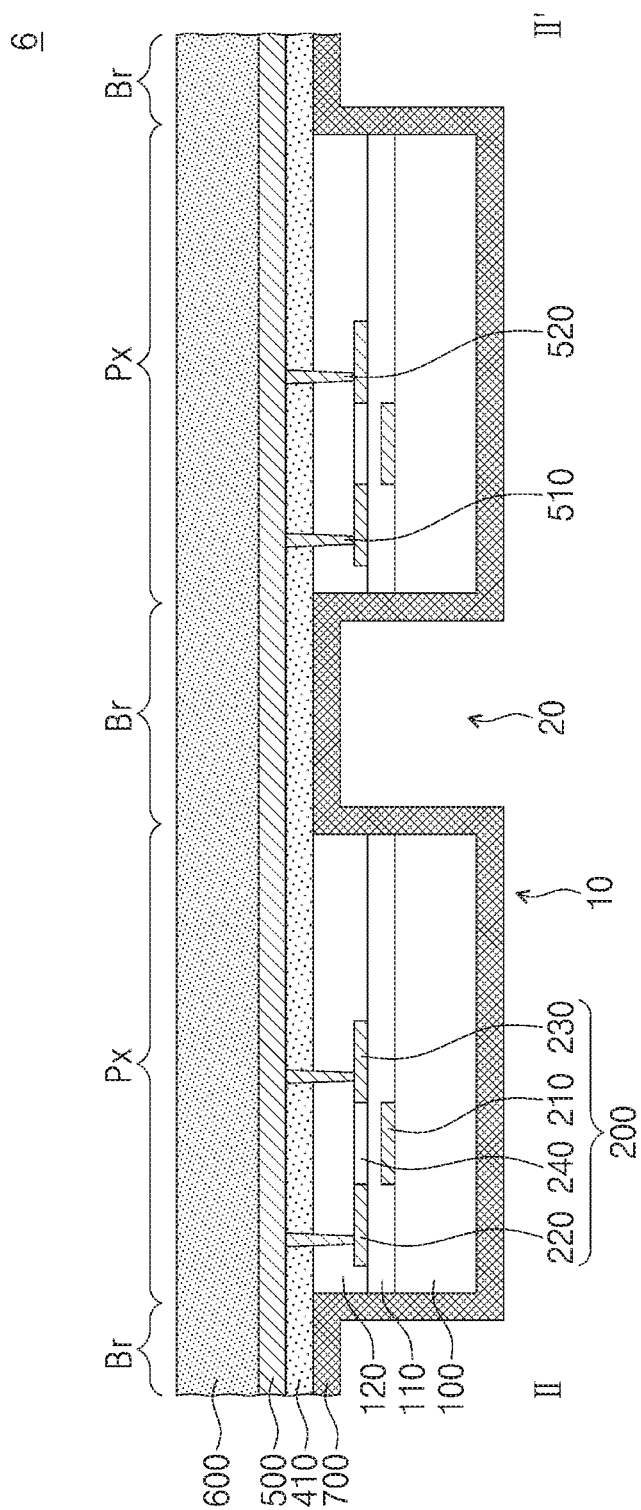

FIG. 8 is a plan view illustrating a flexible electronic device according to another embodiment of the inventive concept. FIGS. 9A and 9B are cross-sectional views illustrating a flexible electronic device according to another embodiment of the inventive concept and taken along lines I-I' and II-II' of FIG. 8, respectively.

Referring to FIGS. 8, 9A, and 9B, a flexible electronic device 6 may include device units 10, a first etching preventing layer 410, a conductive line 500, a flexible substrate 600, and a flexible protective layer 700. Each of the device units 10 may include a protective substrate 100, an insulating layer 110, a first encapsulation layer 120, and a driving part 200. Components of each of the device units 10 may be substantially the same as described above. According to another embodiment, unlike as illustrated, the flexible electronic device 6 may further include a second encapsulation layer 130 and a light emitting part 300. According to another embodiment, unlike as illustrated, the flexible electronic device 6 may omit a protective substrate 100 and include a second etching preventing layer 420.

The flexible substrate 600 may have pixel areas Px and a bridge area Br in terms of the plane as in FIG. 8. The pixel areas Px may be substantially the same as described above. The bridge area Br may surround the pixel areas Px and separate the pixel areas Px from each other. The bridge area Br may include openings A. The first etching preventing layer 410 and the flexible substrate 600 of the bridge area Br corresponding to the openings A may be removed. The first etching preventing layer 410 and the flexible substrate 600 of the bridge area Br corresponding to the openings A may be removed through a patterning process. As in FIG. 9A, the bridge area Br, which is removed through the patterning process, may not include the conductive line 500. As the first etching preventing layer 410 and the flexible substrate 600 of the bridge area Br corresponding to the openings A are removed, the curved bridge area Br may be provided between the pixel areas Px. As in FIG. 9B, the curved bridge area Br may include the conductive line 500. The curved bridge area Br may connect the pixel areas Px. Although the curved bridge area Br connecting the pixel areas Px may have a "V"-shape, a "U"-shape, or a rotated "S"-shape in terms of the plane, the embodiment of the inventive concept is not limited thereto.

FIGS. 10 to 15 are cross-sectional views for explaining a method for manufacturing the flexible electronic device in FIG. 4 and taken along line I-I' of FIG. 1. Hereinafter, a description overlapped with that described above will be omitted.

Although the single device unit 10 is described for simplicity of description, the embodiment of the inventive concept is not limited thereto. Hereinafter, when manufacturing methods are described, in case of a process before the flexible substrate 600 is provided, the pixel areas Px and the bridge area Br represent virtual areas corresponding to the pixel areas Px and the bridge area Br when the flexible substrate 600 is provided, respectively.

Referring to FIG. 10, the driving part 200 may be formed on the protective substrate 100. More particularly, the gate pattern 210 may be formed on the protective substrate 100. For example, the forming of the gate pattern 210 may include forming a conductive layer on the protective substrate 100 and patterning the conductive layer. The patterning of the conductive layer may be performed by an etching process using a mask. The mask may be formed by a photolithography process. For another example, the forming of the gate pattern 210 may be performed by a printing method using a metal paste. Although not shown, a conductive line may be further formed on the protective substrate 100 and connected to the gate pattern 210. The insulating layer 110 may be formed on the protective substrate 100 to cover the gate pattern 210. The insulating layer 110 is the same as described above in FIGS. 1 and 2.

The source pattern 220, the drain pattern 230, and the active pattern 240 may be formed on the insulating layer 110. The source pattern 220 and the drain pattern 230 may be spaced apart from each other. The source pattern 220 and the drain pattern 230 may be formed by a single process. The forming of the source pattern 220 and the drain pattern 230 may include forming a conductive layer on the protective substrate 100 and patterning the conductive layer. For another example, the forming of the source pattern 220 and the drain pattern 230 may be performed by a printing method using a metal paste.

The active pattern 240 may be formed between the source pattern 220 and the drain pattern 230. The forming of the active pattern 240 may include forming a semiconductor layer covering the insulating layer 110 and patterning the semiconductor layer. The active pattern 240 may be formed before or after the source pattern 220 and the drain pattern 230 are formed. A protective layer (not shown) may be further formed on the active pattern 240 to cover the active pattern 240.

The driving part 200 may be formed in plurality. The forming of a plurality of driving parts 200 may be performed by a single process. For example, a plurality of gate patterns 210 may be formed by a single process, and a plurality of source patterns 220 and a plurality of drain patterns 230 may be formed by a single process. The driving parts 200 may be formed on the pixel areas Px, respectively. Hereinafter, the single driving part 200 will be described.

Figure 11:
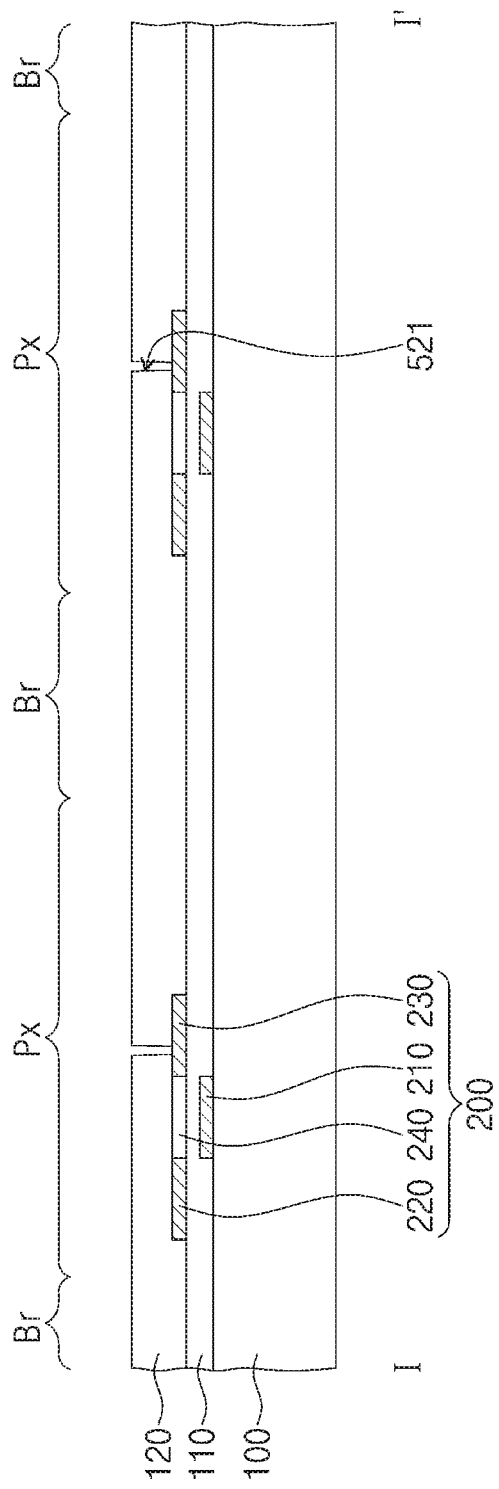

Referring to FIG. 11, the first encapsulation layer 120 is formed on the insulating layer 110 to cover the source pattern 220, the drain pattern 230, and the active pattern 240. The first encapsulation layer 120 may have a substantially flat top surface. The forming of the first encapsulation layer 120 may be performed by a deposition process. For another example, the forming of the first encapsulation layer 120 may be performed by a spin coating method, a bar-coating method, or a spray coating method. A second via hole 521 may be formed in the first encapsulation layer 120 to expose the drain pattern 230. The forming of the second via hole 521 may be performed by a photolithography method.

Figure 12:
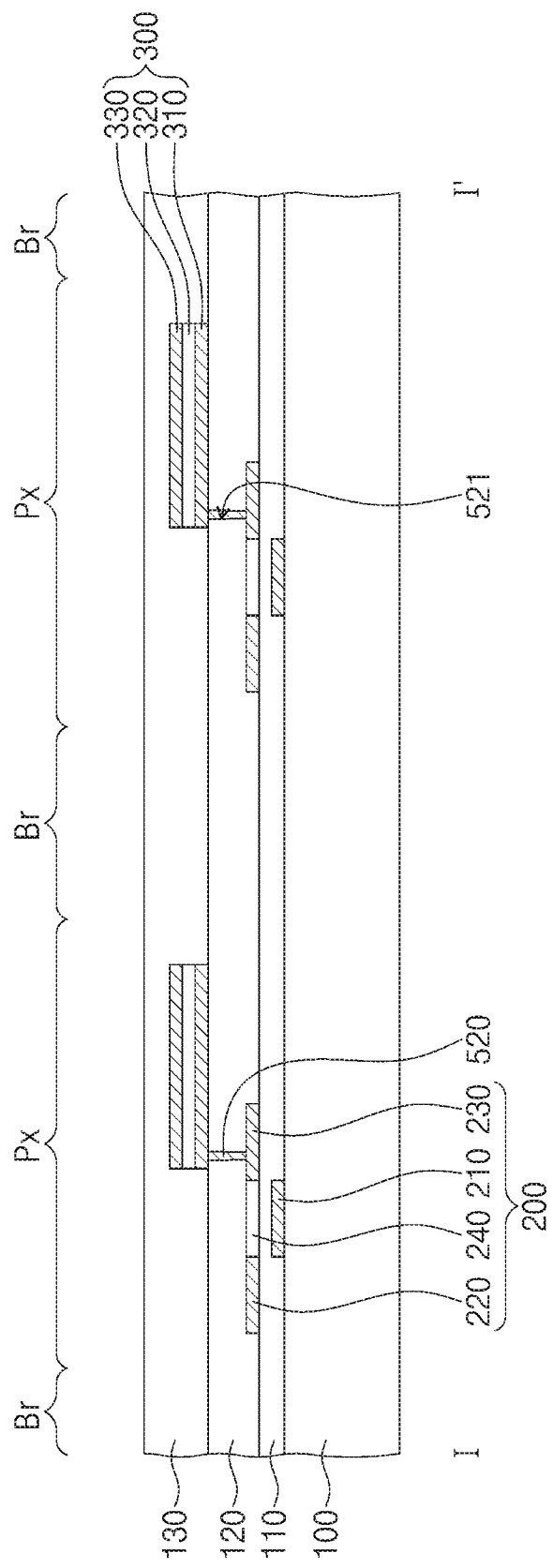

Referring to FIG. 12, the second conductive via 520, the light emitting part 300, and the second encapsulation layer 130 may be formed. The second conductive via 520 may be formed in the second via hole 521. The second conductive via 520 may fill the second via hole 521. As the first electrode 310, the light emitting layer 320, and the second electrode 330 are formed on the first encapsulation layer 120, the light emitting part 300 may be formed. The first electrode 310 may be formed on the second conductive via 520 and connected to the second conductive via 520. For example, the first electrode 310, the light emitting layer 320, or the second electrode 330 may be formed by a deposition process. For another example, the first electrode 310, the light emitting layer 320, or the second electrode 330 may be formed by a printing process (e.g., an inkjet printing process). According to another embodiment, unlike as illustrated, an electrode connection portion (not shown) may be further formed on the first encapsulation layer 120 and connected to the second electrode 330. The light emitting part 300 may be formed in plurality. A plurality of light emitting parts 300 may be formed at the same time by a single process. The light emitting parts 300 may be formed on the pixel areas Px, respectively. Hereinafter, the single light emitting part 300 will be described.

The second encapsulation layer 130 may be formed on the first encapsulation layer 120 to cover the first electrode 310, the light emitting layer 320, or the second electrode 330. The second encapsulation layer 130 may seal the light emitting part 300. The forming of the second encapsulation layer 130 may be performed by a thermal evaporation method, a facing target sputtering method, a chemical vapor deposition (CVD) method, or an atomic layer deposition (ALD) method. For another example, the forming of the second encapsulation layer 130 may be performed by an inkjet printing method, a spin coating method, a bar-coating method, or a spray coating method.

Figure 13:
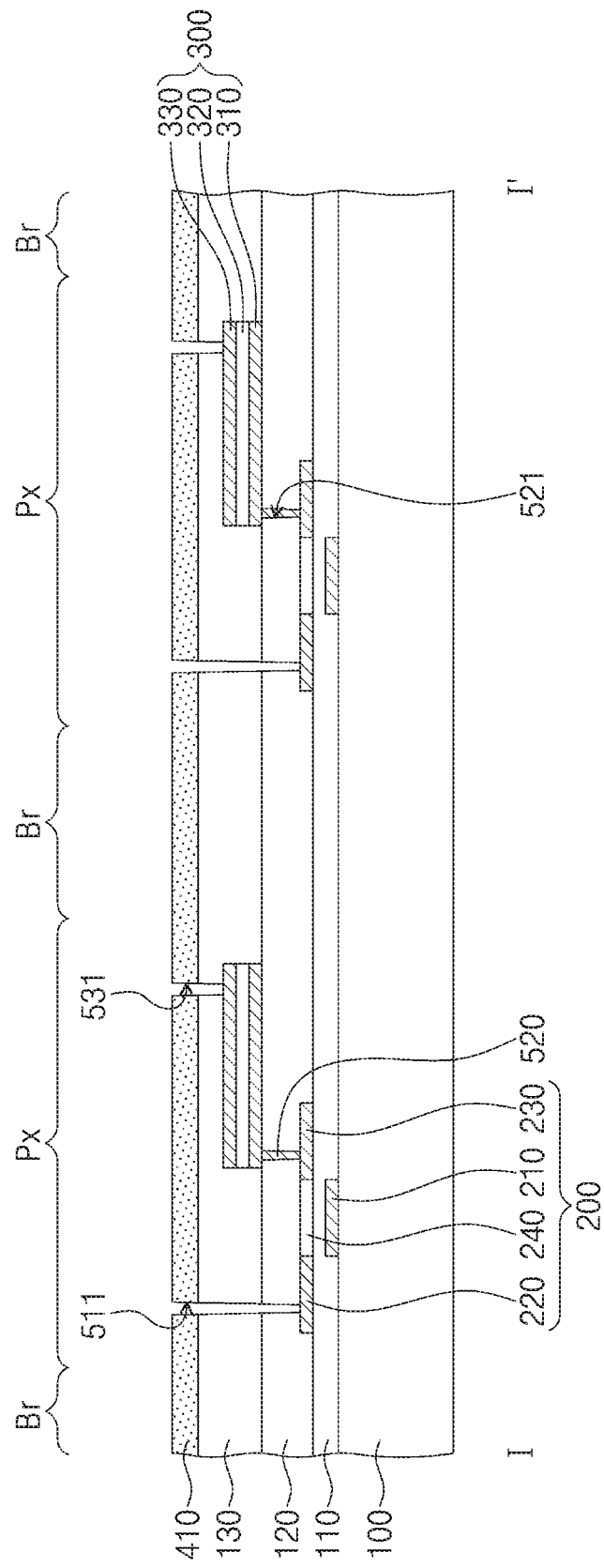

Referring to FIG. 13, the first etching preventing layer 410 may be formed on the second encapsulation layer 130. The forming of the first etching preventing layer 410 may be performed by a deposition process. For another example, the forming of the first etching preventing layer 410 may be performed by a spin coating method, a bar-coating method, or a spray coating method. A first via hole 511 may be formed in the first etching preventing layer 410, the second encapsulation layer 130, and the first encapsulation layer 120. The first via hole 511 may pass through the first etching preventing layer 410, the second encapsulation layer 130, and the first encapsulation layer 120 to expose the source pattern 220. A third via hole 531 may be formed in the first etching preventing layer 410 and the second encapsulation layer 130. The third via hole 531 may pass through the first etching preventing layer 410 and the second encapsulation layer 130 to expose the second electrode 330.

Figure 14:
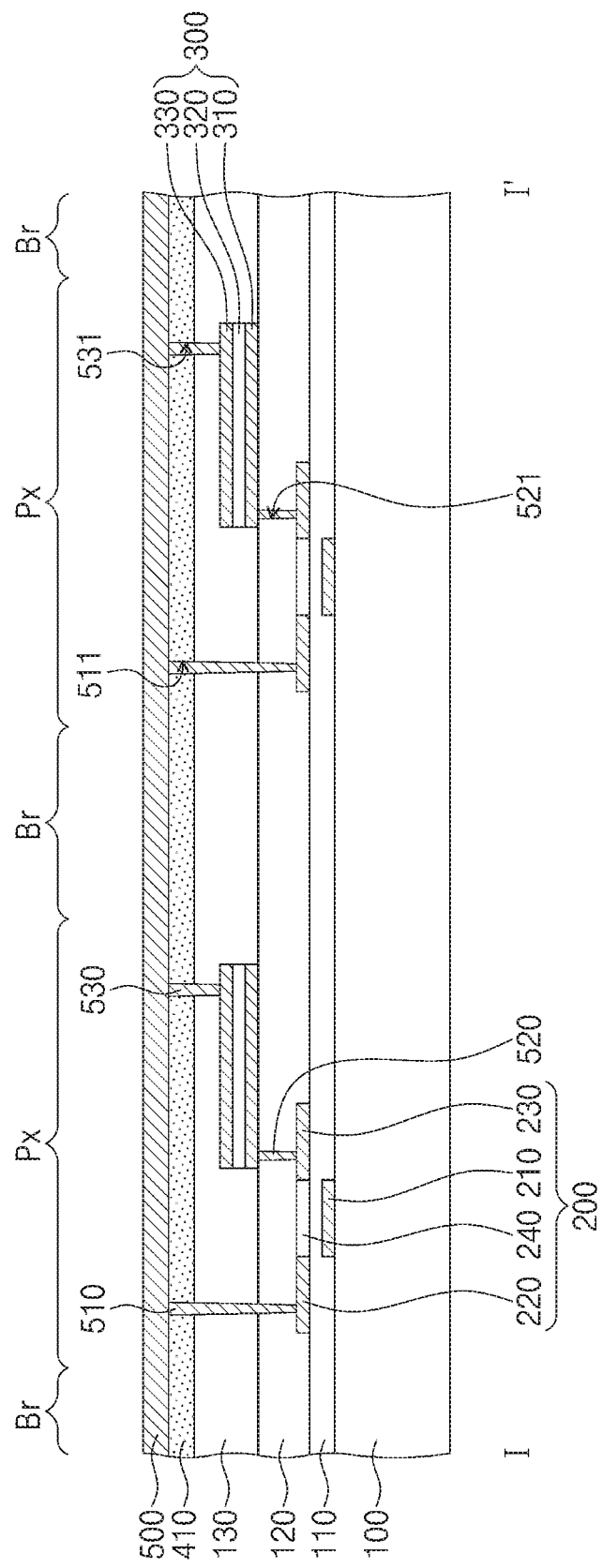

Referring to FIG. 14, the first conductive via 510, the third conductive via 530, and the conductive line 500 may be formed. The first conductive via 510 may fill the first via hole 511. The third conductive via 530 may fill the third via hole 531. The first conductive via 510 may be connected to the source pattern 220. The third conductive via 530 may be connected to the second electrode 330. According to another embodiment, unlike as illustrated, the third conductive via 530 may be connected to an electrode connection portion (not shown).

The conductive line 500 may be formed on the first conductive via 510, the third conductive via 530, and the first etching preventing layer 410. For example, a metal layer is formed on the first etching preventing layer 410. The metal layer may be patterned to form the conductive line 500. The conductive line 500 is the same as described above with reference to FIG. 3. For example, the conductive line 500 may be connected to the first conductive via 510 and the third conductive via 530.

Figure 15:
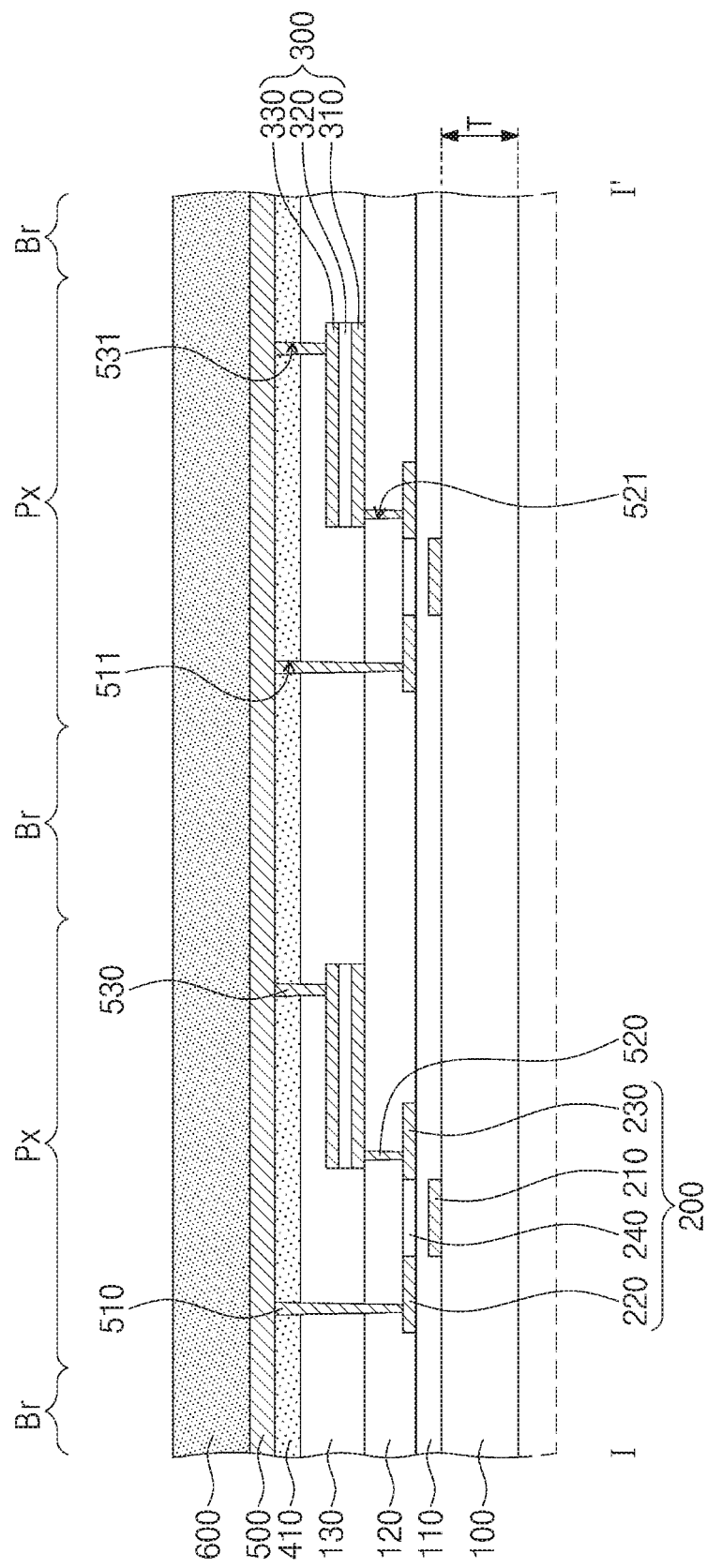

Referring to FIG. 15, the flexible substrate 600 may be formed on the conductive line 500 and the first etching preventing layer 410. The flexible substrate 600 may be formed on the first etching preventing layer 410 to cover the conductive line 500. For example, an insulating polymer may be applied and cured on the first etching preventing layer 410 and the conductive line 500 to form the flexible substrate 600.

Thereafter, as a portion of the protective substrate 100 is removed as illustrated by a dotted line, a thickness of the protective substrate 100 may be reduced. The removing of the protective substrate 100 may be performed by an etching process using hyrdofluoric acid or a fluorine-based etching solution such as buffered oxidant etchant (BOE). The protective substrate 100 may have a reduced thickness T of about 0.1 μm to about 150 μm, more particularly about 1 μm to about 50 μm.

Referring to FIG. 3, as the trench 20 is formed in the bridge area Br, the device units 10 may be separated from each other. The device units 10 may be spaced apart from each other by the trench 20. The forming of the trench 20 may include performing a cutting process on the protective substrate 100, the insulating layer 110, the first encapsulation layer 120, and the second encapsulation layer 130. The cutting process may include a process of using a laser or an etching process using photolithography. The protective substrate 100, the insulating layer 110, the first encapsulation layer 120, and the second encapsulation layer 130 on the bridge area Br may be removed by the cutting process. As the thickness of the protective substrate 100 is reduced as described with reference to FIG. 15, the trench 20 may be easily formed in the protective substrate 100. The cutting process may be performed until the conductive line 500 and the flexible substrate 600 are exposed. After the trench 20 is formed, the conductive line 500 and the flexible substrate 600 may be remained in the bridge area Br.

Thereafter, the flexible protective layer 700 may be formed to conformally cover a bottom surface of each device unit 10 and an inside of each trench 20. For example, the flexible protective layer 700 may be formed by applying and curing an insulating polymer on the bottom surface of each device unit 10 and the inside of each trench 20.

According to embodiments, mutually corresponding components of the device units 10 may be simultaneously formed by a single process. For example, the second encapsulation layer 130 of one of the device units 10 and the second encapsulation layer 130 of another of the device units 10 may be formed by a single process. The protective substrate 100, the insulating layer 110, the first encapsulation layer 120, the second encapsulation layer 130, the conductive line 500, and the flexible substrate 600, which are described in FIGS. 10 to 15, may be formed on the pixel areas Px and the bridge area Br. Thereafter, the device units 10 may be separated from each other by the cutting process. Thus, a manufacturing process of the flexible electronic device 2 may be simplified, and the flexible electronic device 2 may be further easily manufactured. The manufacturing of the flexible electronic device 2 may be completed by the manufacturing method described so far.

A method for manufacturing the electronic device using a transfer process may transfer a chip on a flexible and stretchable substrate to be bent and stretched in a three-dimensional curve. However, this method is extremely slow and has a high failure rate and high costs. In contrast, the flexible electronic device 2 according to an embodiment of the inventive concept may be further simply manufactured, reduce manufacturing costs, and be bent and stretched in the three-dimensional curve.

A method for manufacturing the flexible electronic device 3 in FIG. 5 may further include a process of forming the second etching preventing layer 420 and a process of etching the protective substrate 100 after the cutting process in addition to the method for manufacturing the flexible electronic device 2 in FIG. 3. Here, the second etching preventing layer 420 may be formed on the pixel areas Px.

A method for manufacturing the flexible electronic device 6 in FIGS. 8, 9A, and 9B may further include a process of patterning and partially removing the bridge area Br after the flexible substrate 600 is formed in addition to the method for manufacturing the flexible electronic device 2 in FIG. 3. The bridge area Br may be patterned through a mask including the openings A.

Figure 16:
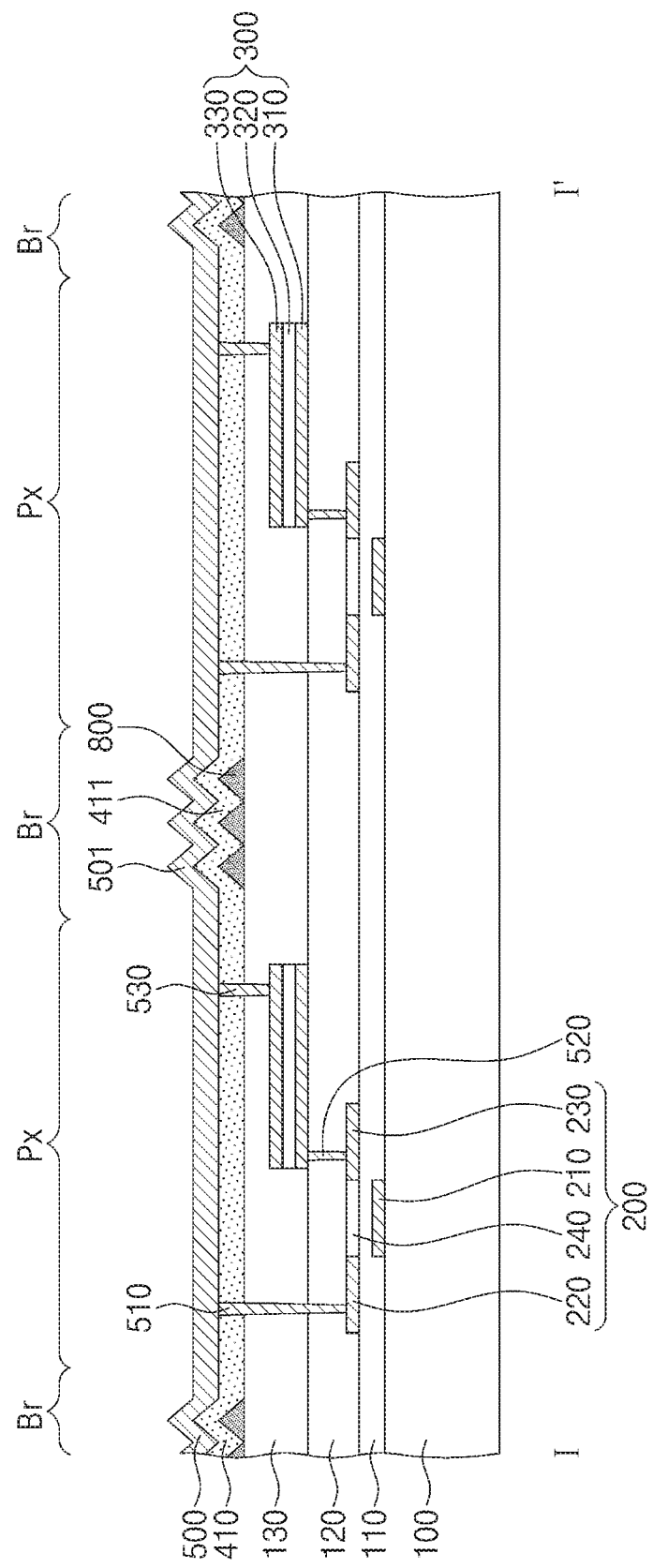
FIGS. 16 to 18 are cross-sectional views for explaining a method for manufacturing a flexible electronic device according to another embodiment of the inventive concept and taken along line I-I' of FIG. 1.
Figure 17:
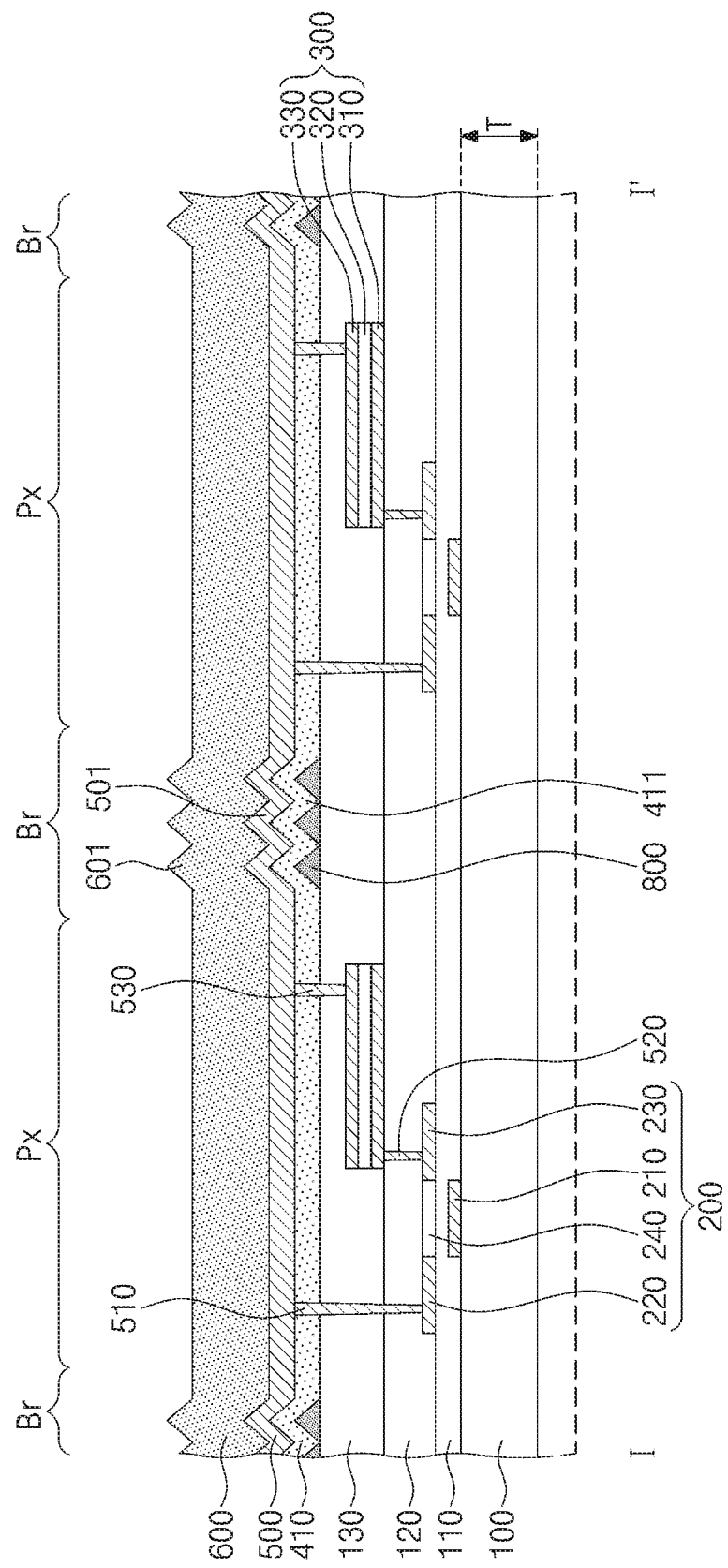
Figure 18:
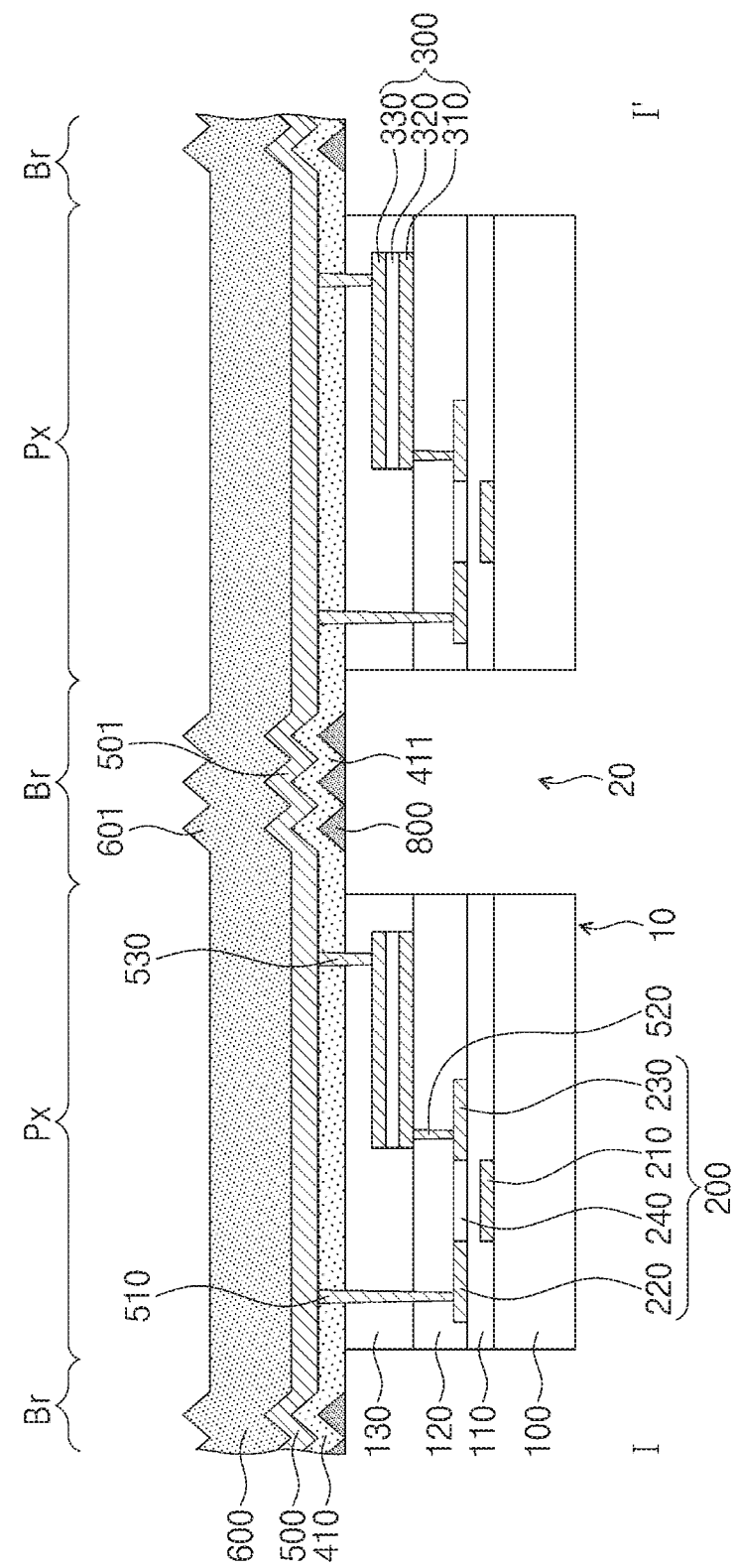

FIGS. 16 to 18 are cross-sectional views for explaining a method for manufacturing the flexible electronic device in FIG. 6 and taken along line I-I' of FIG. 1. Hereinafter, a description overlapped with that described above will be omitted.

Referring to FIG. 16, the protective substrate 100, the insulating layer 110, the first encapsulation layer 120, the second encapsulation layer 130, the driving part 200, the light emitting part 300, the first conductive via 510, the second conductive via 520, and the third conductive via 530 may be performed by the substantially same method as that described in FIGS. 10 to 15.

First insulating structures 800 may be formed on the second encapsulation layer 130. The first insulating structures 800 may be formed on the bridge area Br or may not be formed on the bridge area Br. For example, the first insulating structures 800 may include a polymer such as polyimide and/or polydimethylsiloxane. The first insulating structures 800 may be flexible, conformable, and stretchable. Each of the first insulating structures 800 may have various shapes such as a polygonal shape (e.g., triangle, rectangle, etc.) or a semi-circular shape.

The first etching preventing layer 410 may be formed on the second encapsulation layer 130 and the first insulating structures 800. The first etching preventing layer 410 may be conformally formed on the first insulating structures 800. The first etching preventing layer 410 may extend along the first insulating structures 800 on the bridge area Br. Thus, the wrinkle structure 411 of the first etching preventing layer 410 may be formed.

The conductive line 500 may be formed on the first etching preventing layer 410. The conductive line 500 may extend along the wrinkle structure 411 of the first etching preventing layer 410 on the bridge area Br. Thus, the wrinkle structure 501 of the conductive line 500 may be formed.

Referring to FIG. 17, the flexible substrate 600 may be formed on the first etching preventing layer 410 and the conductive line 500. The flexible substrate 600 may be conformally formed on the conductive line 500. The flexible substrate 600 may extend along the wrinkle structure 411 of the first etching preventing layer 410 and the wrinkle structure 501 of the conductive line 500 on the bridge area Br. Thus, the wrinkle structure 601 of the flexible substrate 600 may be formed.

As a portion of the protective substrate 100 is removed as illustrated by a dotted line, a thickness of the protective substrate 100 may be reduced. The removing of the portion of the protective substrate 100 may be performed by the method described above with reference to FIG. 15. The protective substrate 100 may have a reduced thickness T of about 0.1 µm to about 150 µm, more particularly about 1 µm to about 50 µm.

Referring to FIG. 18, as the cutting process is performed on the bridge area Br, the trench 20 may be formed in the bridge area Br. The cutting process may be performed by the method described above with reference to FIG. 3. As the trench 20 is formed, the device units 10 may be separated from each other. After the cutting process, the first insulating structures 800 may be remained instead of being removed. The trench 20 may expose bottom surfaces of the first insulating structures 800. Here, the first insulating structures 800 may protect the first etching preventing layer 410, the conductive line 500, and the flexible substrate 600 from external impurities.

Referring to FIG. 6, the first insulating structures 800 may be removed. When the first insulating structures 800 are removed, the trench 20 may expose the wrinkle structure 411 of the first etching preventing layer 410.

Thereafter, the flexible protective layer 700 may be formed to conformally cover the bottom surface of each device unit 10 and the inside of each trench 20 by the method described above with reference to FIG. 3. The flexible protective layer 700 may extend along the wrinkle structure 411 of the first etching preventing layer 410. Thus, the wrinkle structure 701 of the flexible protective layer 700 may be formed.

The flexible electronic device 4 may be further flexible, conformable, and stretchable by the wrinkle structure 411 of the first etching preventing layer 410, the wrinkle structure 501 of the conductive line 500, the wrinkle structure 601 of the flexible substrate 600, and the wrinkle structure 701 of the flexible protective layer 700.

The wrinkle structure 411 of the first etching preventing layer 410, the wrinkle structure 501 of the conductive line 500, the wrinkle structure 601 of the flexible substrate 600, and the wrinkle structure 701 of the flexible protective layer 700 may not be provided on the pixel areas Px. Thus, although the flexible electronic device 4 is bent or stretched, a damage applied to the device units 10 may be prevented.

In a method for manufacturing the flexible electronic device 5 in FIG. 7, the first insulating structures 800 forming the wrinkle structures (e.g. 411, 501, 601, and 701 as shown in FIG. 6) of the method for manufacturing the flexible electronic device 4 described above in FIG. 6 may be replaced by a second insulating structure (not shown) forming the slab structures 412, 502, 602, and 702 as in FIG. 7. Thus, the slab structure 412 of the first etching preventing layer 410, the slab structure 502 of the conductive line 500, the slab structure 602 of the flexible substrate 600, and the slab structure 702 of the flexible protective layer 700 may be formed.

Figure 19:
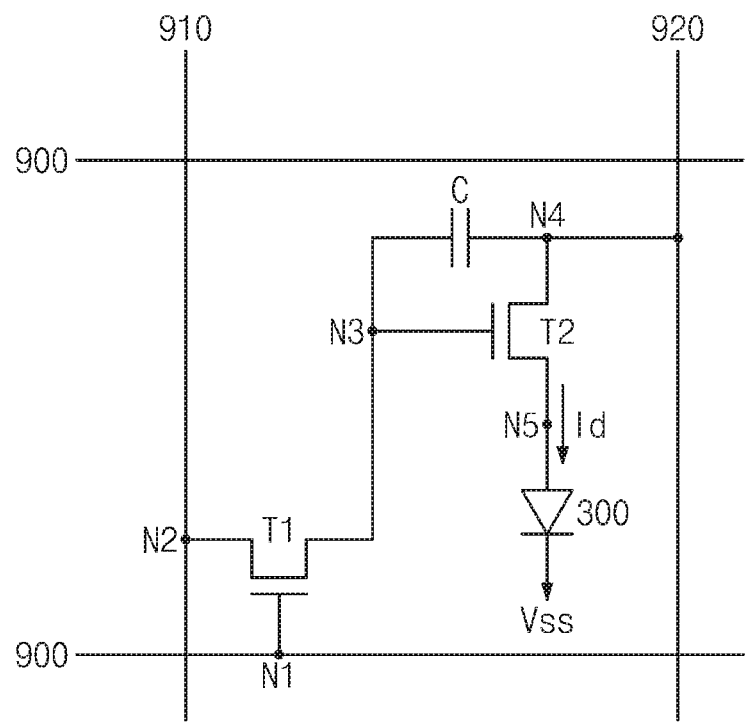
FIG. 19 is a circuit diagram of one of the device units of the flexible electronic device according to the embodiments of the inventive concept.

FIG. 19 is a circuit diagram of one of the device units of the flexible electronic device according to the embodiments. Hereinafter, a description overlapped with that described above will be omitted. Hereinafter, the single device unit will be described.

Referring to FIG. 19, the flexible electronic device may include gate lines 900, a data line 910, and a driving voltage line 920. The gate lines 900 may transmit a scan signal. Each of the gate lines 900 may extend in one direction (e.g., a row direction). The data lines 910 may transmit a data signal. The data line 910 may extend in the other direction (e.g., a column direction). Here, the other direction may cross the one direction. The driving voltage line 920 may transmit a driving voltage. The device unit 10 may include a switching transistor T1, a driving transistor T2, a capacitor C, and a light emitting part 300.

The switching transistor T1 may be connected to a first terminal N1, a second terminal N2, and a third terminal N3. Here, the first terminal N1 may function as a control terminal of the switching transistor T1 and be connected to the gate line 900. The second terminal N2 may function as an input terminal of the switching transistor T1 and be connected to the data line 910. The third terminal N3 may function as an output terminal of the switching transistor T1 and be connected to the driving transistor T2.

The switching transistor T1 may transmit the data signal, which is received from the data line 910, to the driving transistor T2 in response to the scan signal received from the gate line 900. The driving transistor T2 may be connected to a third terminal N3, a fourth terminal N4, and a fifth terminal N5. The third terminal N3 may function as a control terminal of the driving transistor T2 and be connected to the switching transistor T1. The fourth terminal N4 may function as an input terminal of the driving transistor T2 and be connected to the driving voltage line 920. The fifth terminal N5 may function as an output terminal of the driving transistor T2 and be connected to the light emitting part 300. The driving transistor T2 may allow an output current Id having a magnitude, which is varied according to a voltage applied between the third terminal N3 and the fifth terminal N5, to flow. The capacitor C may be connected between the third terminal N3 and the fourth terminal N4 of the driving transistor T2. The capacitor C may charge the data signal, which is applied to the third terminal N3 of the driving transistor T2, and maintain the charged data signal even after the switching transistor T1 is turned-off. The driving transistor T2 may correspond to the above-described driving part 200.

For example, the light emitting part 300 may be an organic light emitting diode (OLED). The light emitting part 300 may have an anode connected to the fifth terminal N5 and a cathode connected to a common voltage Vss. The light emitting part 300 may emit light according to the output current Id of the driving transistor T2.

The flexible electronic device according to the embodiment of the inventive concept may be flexible, conformable, and stretchable. Also, the flexible electronic device according to the embodiment of the inventive concept may be bent or stretched without damaging the inner device units.

The method for manufacturing the flexible electronic device according to the embodiment of the inventive concept may simultaneously form the components, which correspond to each other, of the device units by a single process. Thereafter, the device units may be separated from each other by the cutting process. Thus, the manufacturing process of the flexible electronic device may be simplified.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A flexible electronic device comprising:
   device units;
   a first etching preventing layer provided on the device units;
   a conductive line provided on the first etching preventing layer and electrically connected to the device units;
   a flexible substrate configured to cover the conductive line on the first etching preventing layer and the conductive line;
   a trench configured to separate the device units and expose a portion of a bottom surface of the first etching preventing layer and a side surface of each of the device units; and
   a flexible protective layer configured to conformally cover a bottom surface of each of the device units and an inside of the trench,
   wherein each of the device units comprises a protective substrate, driving parts provided on the protective substrate, and a first encapsulation layer configured to cover the driving parts.

2. The flexible electronic device of claim 1, wherein the flexible substrate has a plurality of pixel areas and a bridge area configured to surround the pixel areas,
   the device units are provided on the pixel areas, respectively, and
   the trench is provided on the bridge area.

3. The flexible electronic device of claim 2, wherein each of the first etching preventing layer, the conductive line, and the flexible substrate extends to the bridge area, and
   the device units are connected to each other by the first etching preventing layer and the flexible substrate.

4. The flexible electronic device of claim 2, wherein each of the first etching preventing layer, the conductive line, the flexible substrate, and the flexible protective layer has a wrinkle structure on the bridge area.

5. The flexible electronic device of claim 2, wherein the bridge area comprises openings,
wherein the openings expose a side surface of each of the first etching preventing layer, the flexible substrate, and the flexible protective layer, and
the bridge area comprising the opening has a curved shape to connect the pixel areas.

6. The flexible electronic device of claim 2, wherein the flexible electronic device is bendable such that a separation of surfaces of the flexible protective layer is reduced in the trench.

7. The flexible electronic device of claim 1, wherein the first etching preventing layer comprises a material having an etching selectivity with respect to the first encapsulation layer, and
each of the flexible substrate and the flexible protective layer comprises an insulating polymer.

8. The flexible electronic device of claim 1, wherein each of the driving parts comprises a gate pattern, a source pattern, a drain pattern, and an active pattern, and the flexible electronic device further comprises an insulating layer between the gate pattern and the first encapsulation layer.

9. The flexible electronic device of claim 8, wherein the source pattern, and the drain pattern are electrically connected to the conductive line.

10. The flexible electronic device of claim 8, further comprising:
light emitting parts provided on the first encapsulation layer; and
a second encapsulation layer configured to cover the light emitting parts.

11. The flexible electronic device of claim 10, wherein each of the light emitting parts comprises a first electrode, a light emitting layer, and a second electrode,
wherein the first electrode is electrically connected to the drain pattern, and the second electrode is electrically connected to the conductive line.

12. The flexible electronic device of claim 10, wherein each of the protective substrate, the insulating layer, the first encapsulation layer, and the second encapsulation layer comprises a gas barrier material,
wherein the first encapsulation layer seals the driving parts, and the second encapsulation layer seals the light emitting parts.

* * * * *